(12) United States Patent
Lee et al.

(10) Patent No.: US 12,349,553 B2
(45) Date of Patent: Jul. 1, 2025

(54) DISPLAY DEVICE

(71) Applicant: Samsung Display Co., LTD., Yongin-si (KR)

(72) Inventors: Jin-Suk Lee, Gwangmyeong-si (KR); Kohei Ebisuno, Hwaseong-si (KR); Jong Min Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 961 days.

(21) Appl. No.: 17/474,056

(22) Filed: Sep. 14, 2021

(65) Prior Publication Data

US 2022/0246701 A1 Aug. 4, 2022

(30) Foreign Application Priority Data

Jan. 29, 2021 (KR) ......................... 10-2021-0013252

(51) Int. Cl.
| | |
|---|---|
| H01L 27/32 | (2006.01) |
| H10K 50/84 | (2023.01) |
| H10K 59/122 | (2023.01) |
| H10K 59/123 | (2023.01) |
| H10K 59/124 | (2023.01) |
| H10K 59/131 | (2023.01) |
| H10K 59/80 | (2023.01) |

(52) U.S. Cl.
CPC ........... *H10K 59/123* (2023.02); *H10K 50/84* (2023.02); *H10K 59/122* (2023.02); *H10K 59/124* (2023.02); *H10K 59/131* (2023.02); *H10K 59/8051* (2023.02); *H10K 59/8731* (2023.02)

(58) Field of Classification Search
None
See application file for complete search history.

(56) References Cited

U.S. PATENT DOCUMENTS

| | | |
|---|---|---|
| 9,905,761 B2 | 2/2018 | Song et al. |
| 10,930,867 B2 | 2/2021 | Kim et al. |
| 11,211,534 B2 | 12/2021 | Bae et al. |
| 11,611,050 B2 | 3/2023 | Kim et al. |
| 2017/0148856 A1* | 5/2017 | Choi .................... H10K 59/873 |

(Continued)

FOREIGN PATENT DOCUMENTS

| | | |
|---|---|---|
| CN | 110649180 A | 1/2020 |
| KR | 1020160057048 A | 5/2016 |
| KR | 1020160145898 A | 12/2016 |

(Continued)

*Primary Examiner* — William C Trapanese
(74) *Attorney, Agent, or Firm* — CANTOR COLBURN LLP

(57) ABSTRACT

A display device includes: a substrate including a display area and a peripheral area surrounding an opening; a transistor disposed in the display area; a first electrode electrically connected to the transistor; an auxiliary layer disposed between the transistor and the first electrode and overlapping the first electrode in a plan view; a pixel definition layer overlapping the first electrode and an edge of the auxiliary layer in the plan view; an intermediate layer, an emission layer, and a second electrode disposed on the first electrode; at least one or more dams disposed on the peripheral area; and an encapsulation layer disposed on the light-emitting element. The intermediate layer includes a cutting part disposed between the display area and the opening.

20 Claims, 23 Drawing Sheets

(56) References Cited

U.S. PATENT DOCUMENTS

2018/0083211 A1* 3/2018 Lee .................. H10K 59/122
2022/0102678 A1  3/2022 Kim et al.

FOREIGN PATENT DOCUMENTS

| KR | 1020200068150 A | 6/2020 |
| KR | 1020200083047 A | 7/2020 |
| KR | 1020200102580 A | 9/2020 |
| KR | 1020200113957 A | 10/2020 |
| KR | 1020220044061 A | 4/2022 |

* cited by examiner

DISPLAY DEVICE

This application claims priority to and the benefit of Korean Patent Application No. 10-2021-0013252 filed in the Korean Intellectual Property Office on Jan. 29, 2021, the entire contents of which are incorporated herein by reference.

BACKGROUND

(a) Field

The present disclosure relates to a display device.

(b) Description of the Related Art

As various portable electronic devices include camera functions, use of a portable electronic device with a built-in camera function has been increasing at a faster rate than a case of separately carrying a camera.

In the conventional art, because the camera, a flash, a speaker, a photosensor, and the like are provided outside of an image display area of the electronic device, there is a tendency for a space where the electronic device displays an image to be decreased.

SUMMARY

Embodiments are to provide a display device having a wide space capable of displaying an image in a display device including an opening area.

In addition, embodiments are to provide a display device with improved display quality. In addition, embodiments are to provide a display device with improved reliability.

A display device according to an embodiment includes: a substrate including: a display area and a peripheral area surrounding an opening; a transistor disposed in the display area; a first electrode electrically connected to the transistor; an auxiliary layer disposed between the transistor and the first electrode and overlapping the first electrode in a plan view; a pixel definition layer overlapping the first electrode and an edge of the auxiliary layer in the plan view; an intermediate layer, an emission layer, and a second electrode disposed on the first electrode; at least one or more dams disposed on the peripheral area; and an encapsulation layer disposed on the light-emitting element, wherein the intermediate layer includes a cutting part disposed between the display area and the opening.

The first electrode may be disposed directly on the auxiliary layer.

The first electrode and the auxiliary layer may have substantially the same shape in the plan view.

The edge of the auxiliary layer may be disposed outside an edge of the first electrode in the plan view.

The edge of the auxiliary layer may be disposed inside the edge of the first electrode in the plan view, and the first electrode may cover a side surface of the auxiliary layer.

The first electrode may include a main body and a protruded part, and the auxiliary layer may overlap the main body in the plan view and may be spaced apart from the protruded part.

The protruded part may be electrically connected to the transistor.

The auxiliary layer may include at least one of titanium and molybdenum.

A thickness of the auxiliary layer may be about 160 angstroms to about 700 angstroms.

A display device according to an embodiment includes: a substrate including a display area and a non-display area; a signal wire disposed in the non-display area; and an auxiliary pattern overlapping the signal wire in a plan view. The signal wire includes a first layer, and a second layer, and an edge of at least a part of the signal wire and the edge of the auxiliary pattern are parallel to each other in the plan view.

The signal wire may include a first signal wire, the auxiliary pattern may include a first auxiliary pattern, and the first auxiliary pattern may be disposed directly on the first signal wire.

The first auxiliary pattern may cover a side surface of the first signal wire.

The signal wire may further include a third layer opposite the first layer with respect to the second layer, and the first layer, the third layer, and the first auxiliary pattern may include the same material.

The display device may further include: a transistor and a light-emitting element disposed on the display area, and the transistor may include: a semiconductor layer positioned on the substrate; a gate electrode overlapping the semiconductor layer in the plan view; and a source electrode and a drain electrode connected to the semiconductor layer. The display device may further include a connection electrode connecting the transistor and the light-emitting element.

The first signal wire may include the same material as at least one of the source electrode and the connection electrode.

The signal wire may include a second signal wire, the auxiliary pattern may include a second auxiliary pattern, and an organic insulating layer may be positioned between the second signal wire and the second auxiliary pattern.

The second signal wire may include the same material as at least one of the source electrode and the connection electrode.

The second auxiliary pattern may include a plurality of holes overlapping the second signal wire in the plan view.

The second signal wire may be provided in plural, and the second auxiliary pattern may be provided in plural, the plurality of second signal wires may overlap the plurality of second auxiliary patterns, respectively.

The plurality of second auxiliary patterns may overlap the second signal wire, and the plurality of second auxiliary patterns may be spaced apart from each other.

The display device may include an auxiliary layer disposed between the transistor and the light-emitting element, and the auxiliary layer, the first auxiliary pattern, and the second auxiliary pattern may include the same material.

An embodiment may provide a display device having the wide space for displaying the image in the display device including the opening area. In addition, an embodiment may provide a display device with improved display quality. Further, an embodiment may provide a display device with improved reliability.

DETAILED DESCRIPTION

Figure 1:
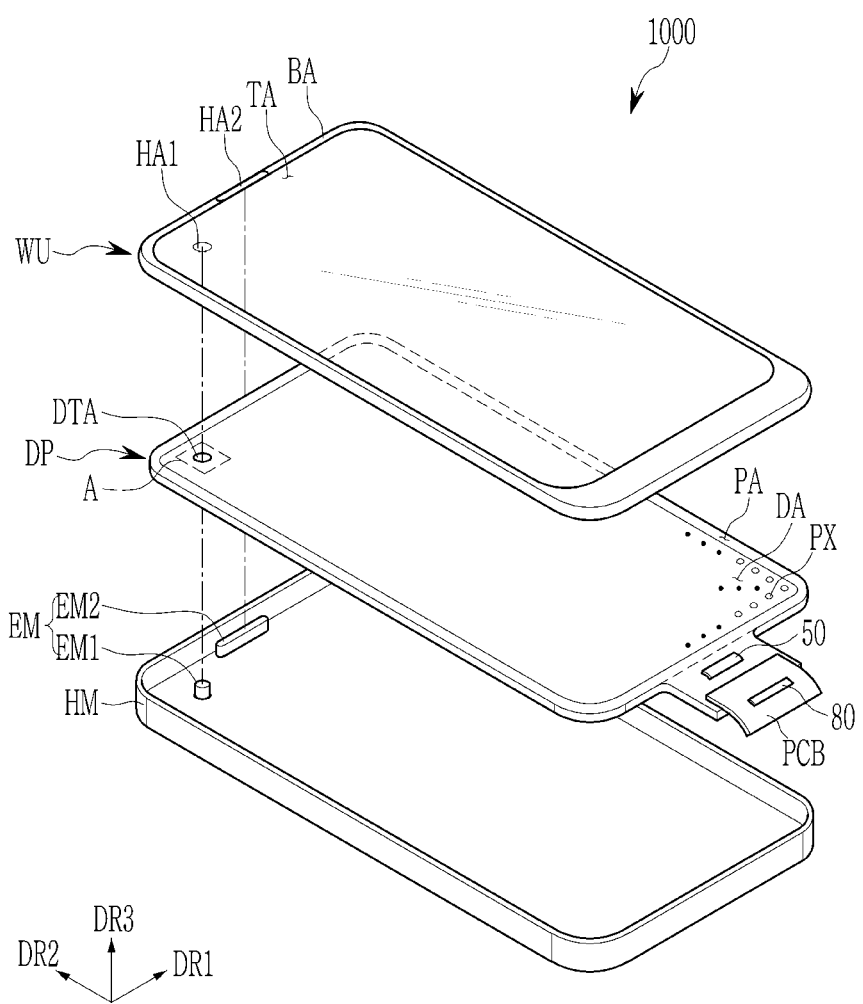
FIG. 1 is an exploded perspective view of a display device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thicknesses of layers, films, panels, areas, etc., are exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprises", and variations such as "comprises" or "comprising", will be understood to imply the inclusion of stated elements but not the exclusion of any other elements. Further, in the specification, the phrase "on a cross-section" means when a cross-section taken by vertically cutting an object portion is viewed from the side.

Now, a display device according to an embodiment is schematically described with reference to FIG. 1 to FIG. 3. FIG. 1 is an exploded perspective view of a display device according to an embodiment, FIG. 2 is a schematic cross-sectional view of a display device according to an embodiment, and FIG. 3 is a top plan view showing some constituent elements of a display panel according to an embodiment.

Figure 2:
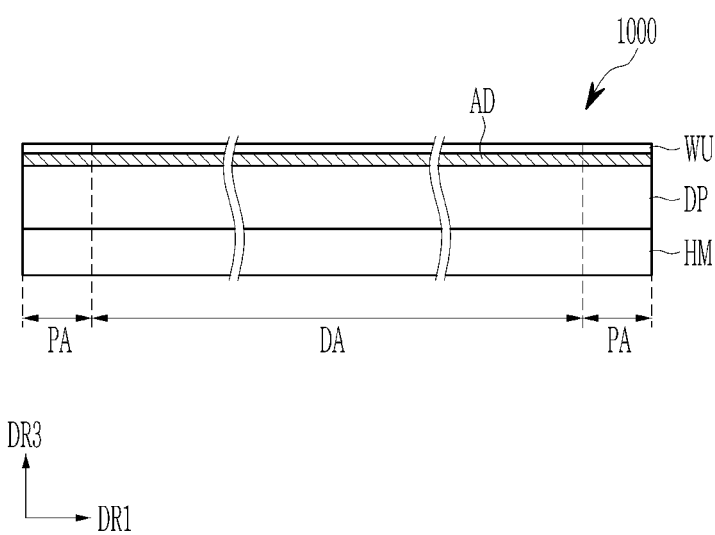
FIG. 2 is a schematic cross-sectional view of a display device according to an embodiment.
Figure 3:
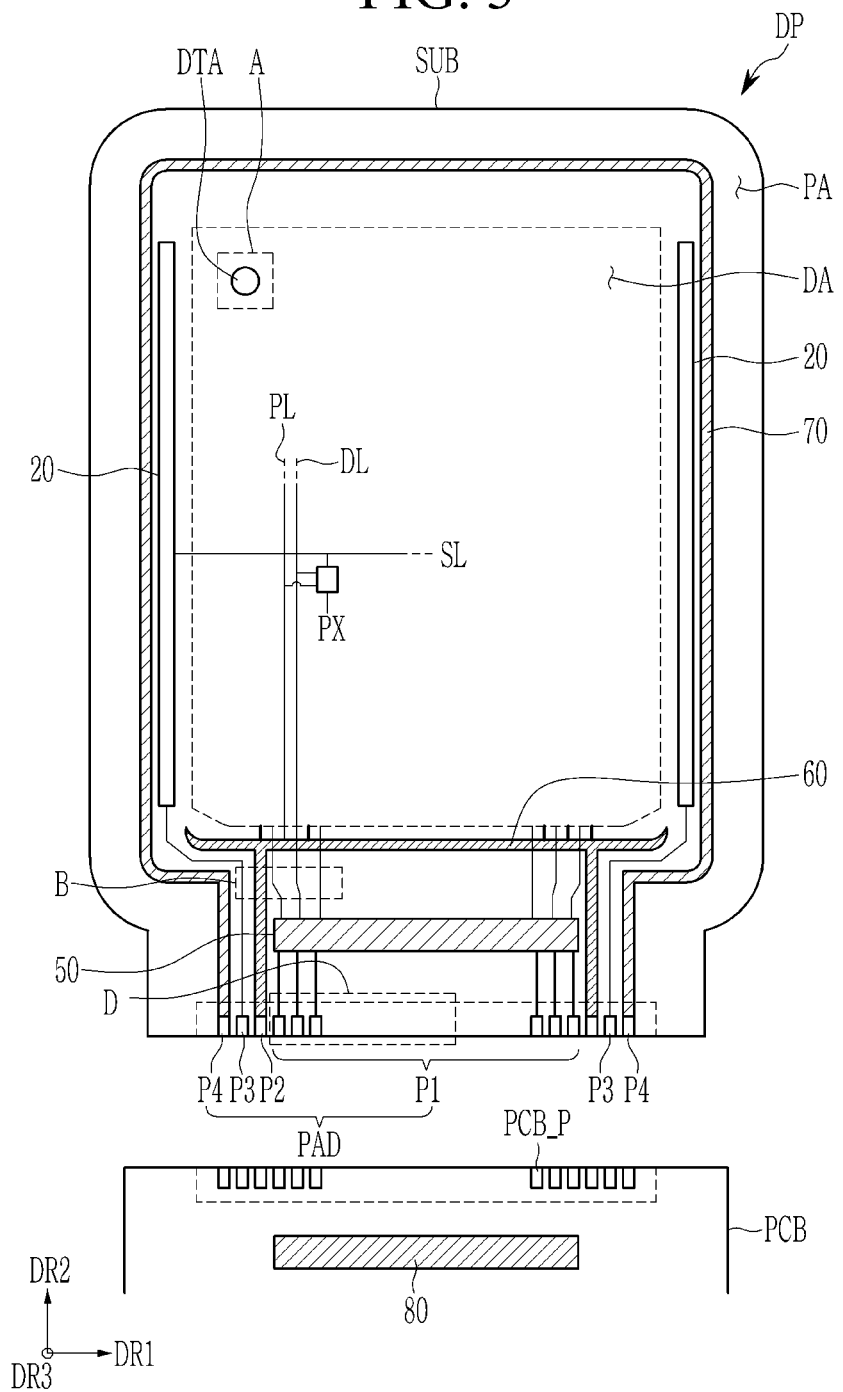
FIG. 3 is a top plan view showing some constituent elements of a display panel according to an embodiment.

First, referring to FIG. 1 and FIG. 2, a display device 1000 displays an image toward a third direction DR3 on a plane defined by a first direction DR1 and a second direction DR2. A front surface (or an upper surface) and a rear surface (or a lower surface) of each member is defined with respect to the third direction DR3. Directions indicated by the first to third directions DR1, DR2, and DR3 are relative concepts and may be converted into other directions.

The display device 1000 of FIG. 1 may display a motion picture or a still image. The display device 1000, as an example, may be used as a display screen of various products such as a television, a laptop, a monitor, a billboard, an internet of things ("IOT"), as well as a portable electronic device such as a mobile phone, a smart phone, a tablet personal computer, a mobile communication terminal, an electronic notebook, an electronic book, a portable multimedia player ("PMP"), a navigation device, an ultra-mobile PC ("UMPC"), etc. Also, the display device 1000 according to an embodiment may be used in wearable devices such as a smart watch, a watch phone, a spectacle display, a head mounted display ("HMD"), etc. Also, a display device 1000 according to an embodiment may be used as an instrument panel of a vehicle, a center fascia of a vehicle or a center information display ("CID") disposed on a dashboard, a room mirror display instead of a side mirror of a vehicle, an entertainment for a back seat of a vehicle, or a display disposed at a rear surface of a front seat. FIG. 1 shows that the display device 1000 according to an embodiment is used as a smartphone for convenience of explanation.

The display device 1000 according to an embodiment includes a cover window WU, a display panel DP, and a housing member HM. In the present embodiment, the cover window WU, the display panel DP and the housing member HM may be coupled to configure the display device 1000.

The cover window WU is disposed on the display panel DP to protect the display panel DP. The cover window WU may include a polyimide window or ultra-thin glass window.

The cover window WU may include a transmission area TA and a blocking area BA. The transmission area TA may be an optically transparent area and an area transmitting incident light. The blocking area BA may be an area having relatively low light transmittance compared to the transmitting area TA. The blocking area BA defines a shape of the transmitting area TA. The blocking area BA may surround the transmitting area TA. The blocking area BA may represent a predetermined color. The blocking area BA overlaps the non-display area PA of the display panel DP in a plan view to block the non-display area PA from being recognized from the outside.

The cover window WU may include a first hole area HA1 and a second hole area HA2. Each of the first hole area HA1 and the second hole area HA2 may overlap an electronic module EM described later. The electronic module EM may be operated by receiving external signals provided through the first hole area HA1 and the second hole area HA2.

According to an embodiment, the first hole area HA1 may be positioned in the transmittance area TA, and the second hole area HA2 may be positioned in the blocking area BA. However, this is only illustrative, and the first hole area HA1 and the second hole area HA2 may be positioned in opposite areas, both in the transmittance area TA, or both in the blocking area BA.

The first hole area HA1 and the second hole area HA2 may have different shapes from each other. The first hole area HA1 may have a circular shape in a plan view, and the second hole area HA2 may have an elliptical shape having a long axis extending along the first direction DR1 in a plan view. However, the shapes of the first hole area HA1 and the second hole area HA2 are not limited thereto, and the sizes and shapes may be variously modified.

The display panel DP may be a flat rigid display panel, but the invention is not limited thereto, and may be a flexible display panel. The display panel according to an embodiment of the present invention may be a light-emissive display panel, and is not particularly limited thereto. For example, the display panel may be an organic light emitting panel or a quantum dot light emitting display panel. The emission layer of the organic light emitting panel may include an organic light emitting material. The emission layer of the quantum dot light emitting display panel may include a quantum dot and a quantum rod. Hereinafter, the display panel is described as an organic light emitting panel.

The display panel DP displays an image on the front. The front of the display panel DP includes a display area DA and a non-display area PA. The image is displayed in the display area DA and not in the non-display area PA. The non-display area PA may surround the display area DA.

The display panel DP may include a plurality of pixels PX positioned in the display area DA. The pixels PX may display light in response to an electrical signal. The light displayed by the pixels PX may realize an image. The number of transistors and capacitors included in one pixel PX and the connection relationship may be varied in different ways.

The display panel DP according to an embodiment may include an opening DTA penetrating the display panel DP. The opening DTA may be positioned on the display area DA. The area A where the opening DTA is positioned is described later. The opening DTA may overlap the first hole area HA1 of the cover window WU in a plan view. Some of a plurality of pixels PX may be disposed surrounding the opening DTA. Therefore, the image may also be displayed in the area adjacent to the opening DTA.

The display panel DP includes the non-display area PA extended from the display area DA and including a plurality of signal lines and pad parts. A data driver 50 may be positioned in the non-display area PA. According to an embodiment, the pad part of the non-display area PA may be electrically connected to a printed circuit board ("PCB") including a driving chip 80, and is described in more detail in FIG. 3.

As shown in FIG. 2, an adhesive layer AD that attaches the display panel DP to the cover window WU may be positioned between the display panel DP and the cover window WU. Although this is not shown in this specification, a touch unit positioned between the display panel DP and the cover window WU may be further included. The touch unit may be disposed on the display panel DP for a touchscreen function of the display device 1000. The touch unit may include a touch electrode of various patterns, and may be a resistive film type or a capacitance type.

The electronic module EM includes various functional modules to operate the display device 1000. The electronic module EM may be electrically connected to the display panel DP through a connector that is not shown. For example, the electronic module EM may be a camera, a speaker, or a sensor for detecting light or heat.

The electronic module EM may include a first electronic module EM1 and a second electronic module EM2. The first electronic module EM1 may detect an external object received through the opening DTA and the first hole area HA1. The first electronic module EM1 may receive external inputs transmitted through the opening DTA and the first hole area HA1 or provide outputs through the opening DTA and the first hole area HA1.

For example, the first electronic module EM1 may be at least one of a light emitting module, a light sensing module, and a photographing module. For example, the first electronic module EM1 may include at least one of a light emitting module that outputs infrared light, a CMOS sensor for infrared detection, and a camera module that photographs an external subject.

The second electronic module EM2 may collect sound signals such as voice through the second hole area HA2 or provide sound signals such as processed voice to the outside. For example, the second electronic module EM2 may include at least one of an acoustic input module and an acoustic output module. The acoustic input module may include a microphone capable of receiving an acoustic signal. The sound output module may include a speaker that outputs sound data as a sound signal.

However, this is illustrated by way of example, and the electronic module EM may consist of a single module, or may further include a greater number of the electronic modules. The electronic module EM may be arranged in various arrangement relationships, and is not limited to any one embodiment.

The housing member HM is disposed under the display panel DP. The housing member HM is combined with the cover window WU to form the exterior of the display device 1000. The housing member HM may contain a material having relatively high rigidity. For example, the housing member HM may include a plurality of frames and/or plates made of glass, plastic, and metal.

The housing member HM provides a predetermined accommodation space. The display panel DP may be accommodated in the accommodation space to be protected from external impact.

Next, referring to FIG. 3, the display panel DP includes a substrate SUB including the display area DA and the non-display area PA. The non-display area PA may be defined along the border of the display area DA.

The display panel DP includes a plurality of pixels PX. A plurality of pixels PX may be disposed in the display area DA on the substrate SUB. Each pixel PX includes a light-emitting element and a driving circuit part connected thereto. Each pixel PX emits light of, for example, red, green, and blue, or white, and may include an organic light emitting element (an organic light emitting diode) as an example.

The display panel DP may include a plurality of signal lines and a pad part PAD. The plurality of signal lines may include a scan line SL extending in the first direction DR1, and a data line DL and a driving voltage line PL extending in the second direction DR2.

A scan driver 20 generates and transmits a scan signal to each pixel PX through the scan line SL. According to an embodiment, the scan driver 20 may be disposed on the left and right sides of the display area DA. This specification shows a structure in which the scan driver 20 is disposed on opposite sides of the substrate SUB, but in another embodiment, the scan driver may be disposed only on one side of the substrate SUB.

The pad part PAD is disposed on one end of the display panel DP and includes a plurality of terminals P1, P2, P3, and P4. The pad part PAD is exposed without being covered by an insulating layer, and may be electrically connected to the printed circuit board (PCB). The pad part PAD may be electrically connected to the pad part PCB_P of the printed circuit board (PCB). The printed circuit board (PCB) may transmit a signal or power of the driving chip 80 to the pad part PAD.

A plurality of image signals transmitted from the outside are converted into a plurality of image data signals, and the converted signals are transmitted to the data driver 50 through the terminal P1. In addition, a control signal for controlling the driving of the scan driver 20 and the data driver 50 may be generated and transmitted to each through the terminals P3 and P1. A driving voltage ELVDD is transmitted to the driving voltage supply wiring 60 through the terminal P2. A common voltage ELVSS is transmitted to each of the common voltage supply wirings 70 through the terminal P4.

The data driver 50 is disposed on the non-display area PA, and generates and transmits a data signal to each pixel PX. The data driver 50 may be disposed on one side of the display panel DP, and may be disposed between the pad part PAD and the display area DA, for example.

The driving voltage supply wiring 60 is disposed on the non-display area PA. For example, the driving voltage supply wiring 60 may be disposed between the data driver 50 and the display area DA. The driving voltage supply wiring 60 provides the driving voltage ELVDD to the pixels PX. The driving voltage supply wiring 60 may be disposed in the first direction DR1, and may be connected to a plurality of driving voltage lines PL extended in the second direction DR2.

The common voltage supply wiring 70 is disposed on the non-display area PA. The common voltage supply wiring 70 may have a shape surrounding the substrate SUB. The common voltage supply wiring 70 transmits the common voltage ELVSS to one electrode (e.g., a second electrode) of the light-emitting element included in the pixel PX.

Figure 4A:
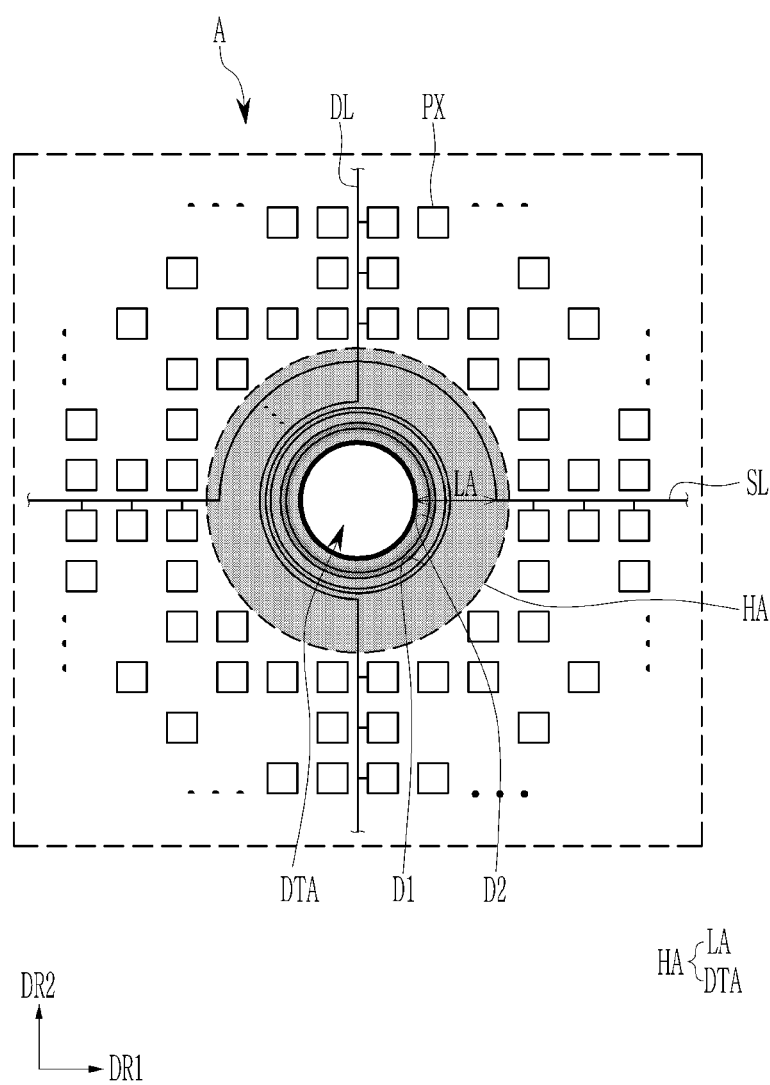
FIG. 4A is an enlarged top plan view of an area A of FIG. 1 and FIG. 3.
Figure 4B:
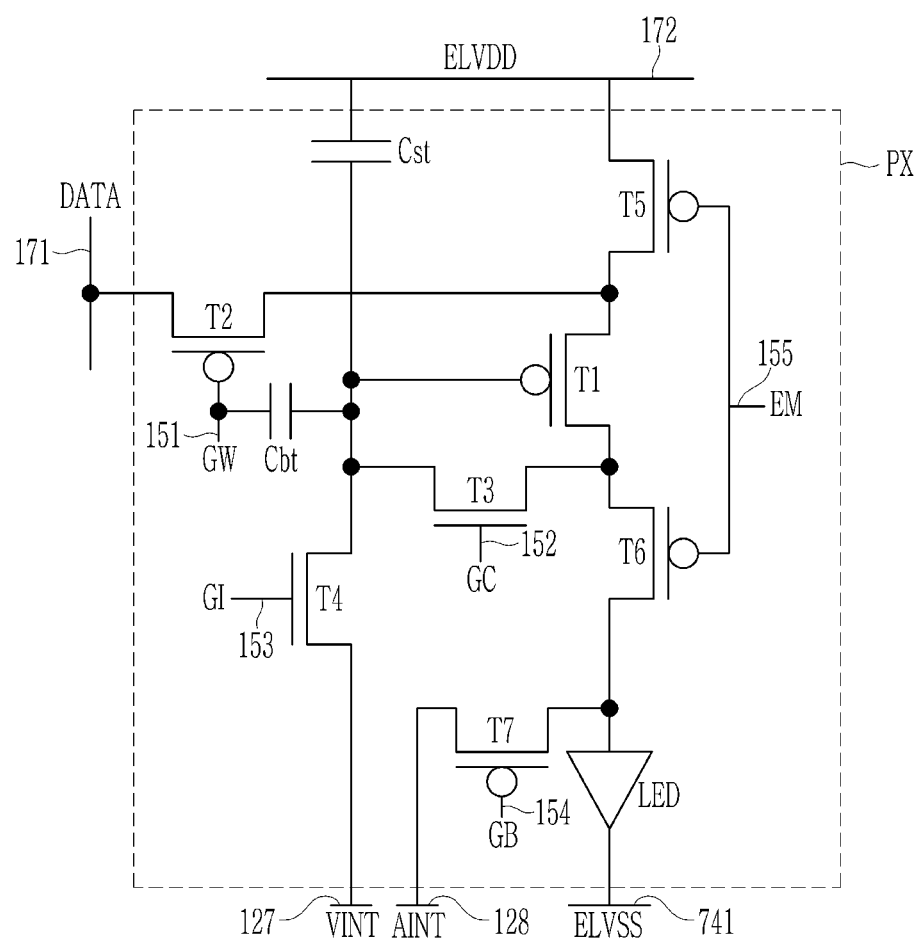
FIG. 4B is a circuit diagram of a display device according to an embodiment.

Next, it is described with reference to FIG. 4A and FIG. 4B. FIG. 4A is an enlarged top plan view of an area A of FIG. 1 and FIG. 3, and FIG. 4B is a circuit diagram of a display device according to an embodiment.

Referring to FIG. 4A with the above-described drawings, the display panel DP includes a plurality of signal lines SL and DL and a plurality of pixels PX, which are disposed on the substrate. Each of a plurality of pixels PX may be connected to a plurality of signal lines SL and DL. FIG. 4A describes the scan line SL and the data line DL among a plurality of signal lines as an example. However, this is illustrated as an example, and each pixel PX according to an embodiment of the present invention may be additionally connected to various signal lines and is not limited to any one embodiment.

A hole area HA included in the display panel DP defines an opening DTA and includes a peripheral area LA surrounding the opening DTA. The peripheral area LA is an area surrounding the periphery of the opening area DTA. The peripheral area LA may function to avoid damaging the wirings when irradiating a laser to form the opening area DTA. It is desirable for the peripheral area LA to be kept at a minimum constant width to achieve the purpose above. The peripheral area LA includes dams D1 and D2. Even though FIG. 4A shows an example having two dams, the number of the dams according to the invention is not limited, and the peripheral area LA may include a plurality of dams D1 and D2.

The scan line SL and the data line DL have a semicircular structure, overlap the peripheral area LA, and may bypass the opening DTA. A plurality of scan lines SL extends in the horizontal direction (e.g., the first direction DR1) along the periphery of the opening area DTA. Here, a plurality of scan lines SL may include a scan line, a light emission control line, an initialization voltage line, or the like according to a signal. A plurality of data lines DL extends in the vertical direction (e.g., the second direction DR2) along the periphery of the opening area DTA. A plurality of data lines DL may be composed of a driving voltage line and a driving low voltage line according to a signal. According to an embodiment, a plurality of scan lines SL and a plurality of data lines DL may be changed.

As shown in FIG. 4B, one pixel PX of a display device according to an embodiment includes a plurality of transistors T1, T2, T3, T4, T5, T6, and T7, a storage capacitor Cst, a boost capacitor Cbt, and a light emitting diode ("LED"), which are connected to several wires 127, 128, 151, 152, 153, 154, 155, 171, 172, and 741.

The plurality of wires 127, 128, 151, 152, 153, 154, 155, 171, 172, and 741 are connected to one pixel PX. The plurality of wires includes a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 is connected to a gate driver (not shown), and transmits the first scan signal GW to the second transistor T2. A voltage of the opposite polarity to the voltage applied to the first scan signal line 151 may be applied to the second scan signal line 152 at the same timing as the signal of the first scan signal line 151. For example, when a negative voltage is applied to the first scan signal line 151, a positive voltage may be applied to the second scan signal line 152. The second scan signal line 152 transmits the second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may be formed of the first scan signal line 151 of the previous stage. The light emission control line 155 transmits a light emission control signal ES to the fifth transistor T5 and the sixth transistor T6.

The data line 171 is a wire that transmits a data voltage DATA generated from a data driver (not shown), and the luminance emitted by the light emitting diode (LED) changes according to the data voltage DATA applied to the pixel PX.

The driving voltage line 172 applies the driving voltage ELVDD. The first initialization voltage line 127 transmits a first initialization voltage VINT, and the second initialization voltage line 128 transmits a second initialization voltage AINT. The common voltage line 741 applies the common voltage ELVSS to the cathode of the light emitting diode LED. In the present embodiment, the voltages applied to the driving voltage line 172, the first and second initialization voltage lines 127 and 128, and the common voltage line 741 may be constant voltages, respectively.

A plurality of transistors may include a driving transistor T1, a second transistor T2, a third transistor T3, a fourth transistor T4, a fifth transistor T5, a sixth transistor T6, and a seventh transistor T7. A plurality of transistors may include an oxide transistor including an oxide semiconductor and a silicon transistor including a polycrystalline silicon semiconductor. For example, the third transistor T3 and the fourth transistor T4 may be made of the oxide transistors, and the driving transistor T1, the second transistor T2, the fifth transistor T5, the sixth transistor T6, and the seventh transistor T7 may be made of the silicon transistors. However, the present invention is not limited thereto, and a plurality of transistors may all be formed of the silicon transistors in another embodiment.

In the above, it has been described that one pixel PX includes seven transistors T1 to T7, one storage capacitor Cst, and one boost capacitor Cbt, but the invention is not limited thereto, and the number of transistors and capacitors and their connection relationships may be changed in many ways.

Figure 5A:
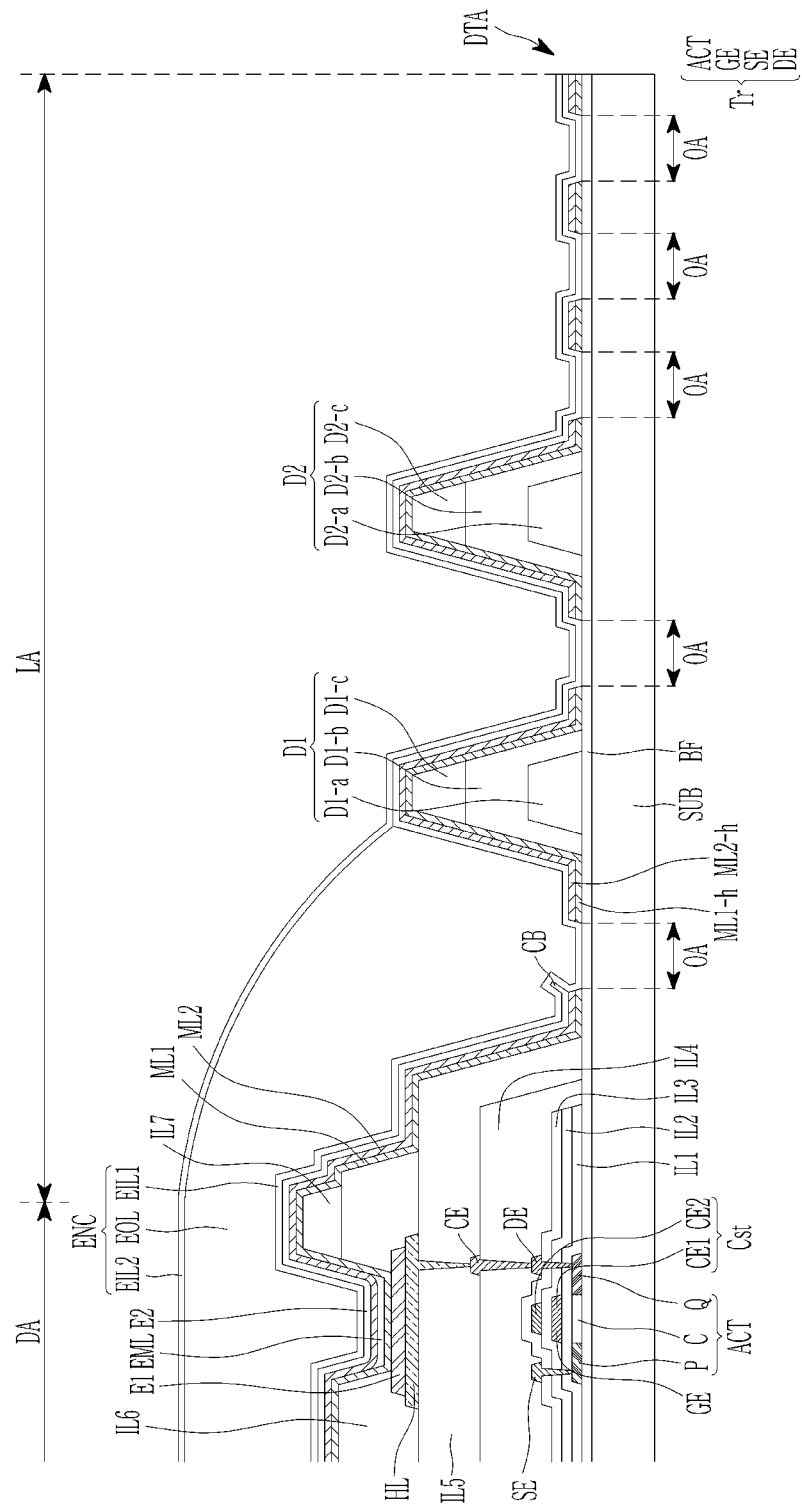
FIG. 5A is a cross-sectional view of a display panel corresponding to some areas according to an embodiment.
Figure 5B:
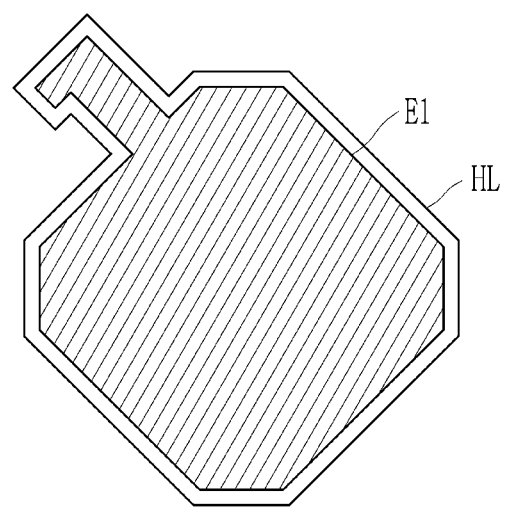
FIG. 5B is a top plan view schematically showing a first electrode and an auxiliary layer.
Figure 5C:
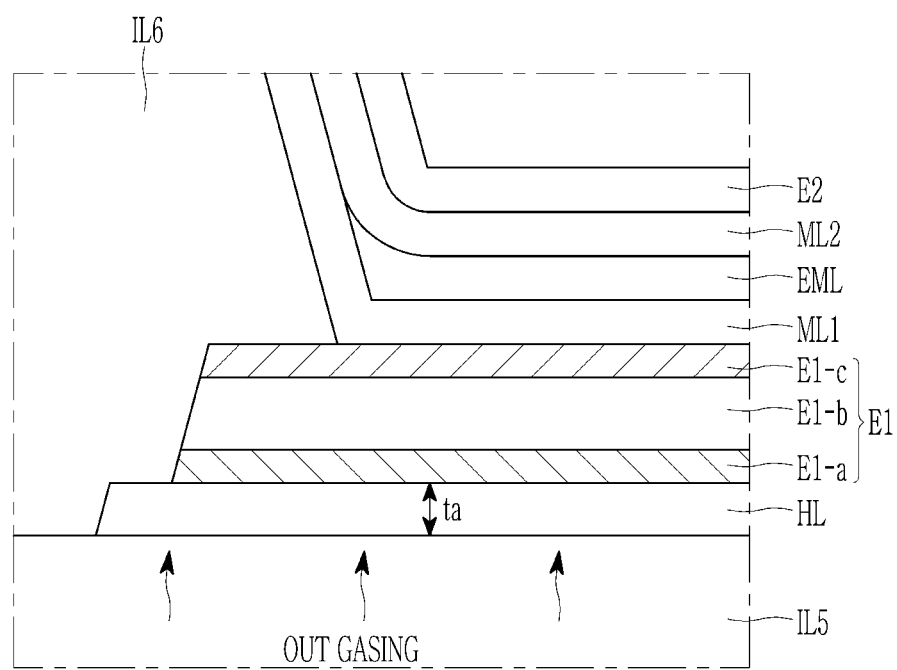
FIG. 5C is an enlarged view of some areas.

Next, it is described with reference to FIG. 5A to FIG. 5C. FIG. 5A is a cross-sectional view of a display panel corresponding to some areas according to an embodiment, FIG. 5B is a top plan view schematically showing a first electrode and an auxiliary layer, and FIG. 5C is an enlarged view of some areas.

Referring to FIG. 5A, first, the stack structure of the display area DA is described. This specification shows the stacked structure of the simplified display area DA, but any stacked structure to implement the circuit if FIG. 4B is possible.

Referring to FIG. 5A, the substrate SUB may have various degrees of flexibility. The substrate SUB may be a rigid substrate or a flexible substrate capable of bending, folding, or rolling.

The substrate SUB may include a glass material or a polymer resin. For example, the polymer resin may include polyether sulfone, polyacrylate, polyether imide, polyethylene naphthalate, polyethylene terephthalide, polyphenylene sulfide, polyarylate, polyimide, polycarbonate, or cellulose acetate propionate, and the like. The substrate SUB may have a multi-layered structure including a layer including the above-described polymer resin and an inorganic layer (not shown).

A buffer film BF may be positioned on the substrate SUB. The buffer film BF blocks impurities from being transferred from the substrate SUB to the upper layer of the buffer film BF, particularly the semiconductor layer ACT, thereby preventing characteristic degradation of the semiconductor layer ACT and reducing a stress. The buffer layer BF may be single-layered or multi-layered including at least one of a silicon oxide (SiOx), a silicon nitride (SiNx), and a silicon oxynitride (SiOxNy). A part or all of the buffer layer BF may be omitted.

A semiconductor layer ACT is positioned on the buffer layer BF. The semiconductor layer ACT may include at least one of polysilicon and an oxide semiconductor. The semiconductor layer ACT includes a channel area C, a first area P, and a second area Q. The first area P and the second area Q are disposed on respective sides of the channel area C. The channel area C may include a semiconductor with a small amount of impurity doped compared to the first area P and the second area Q or without being doped with impurities, and the first area P and the second area Q may include a semiconductor doped with a large amount of the impurity compared to the channel area C. The semiconductor layer ACT may be made of an oxide semiconductor, and in this case, a separate protective layer (not shown) may be added to protect the oxide semiconductor material that is vulnerable to the external environment such as a high temperature.

A first insulating layer IL1 is positioned on the semiconductor layer ACT. The first insulating layer IL1 may be single-layered or multi-layered including at least one of inorganic insulators such as a silicon oxide, a silicon nitride, a silicon oxynitride, an aluminum oxide, a titanium oxide, a tantalum oxide, and a hafnium oxide.

A gate electrode GE and a lower electrode CE1 are positioned on the first insulating layer Il1. The lower electrode CE1 may be a part of the gate electrode GE.

The gate electrode GE may be single-layered or multi-layered with a metal film including any one of copper (Cu), a copper alloy, aluminum (Al), an aluminum alloy, molybdenum (Mo), a molybdenum alloy, titanium (Ti), and a titanium alloy. The gate electrode GE may overlap the channel area C of the semiconductor layer ACT in a plan view.

A second insulating layer IL2 is positioned on the gate electrode GE and the first insulating layer IL1. The second inorganic insulating layer IL2 may be single-layered or multi-layered including at least one among inorganic insulators such as a silicon oxide, a silicon nitride, a silicon oxynitride, an aluminum oxide, a titanium oxide, a tantalum oxide, and a hafnium oxide.

An upper electrode CE2 of the storage capacitor Cst is positioned on the second insulating layer IL2.

The storage capacitor Cst may include the lower electrode CE1 and the upper electrode CE2 which overlap the second insulating layer IL2 interposed therebetween. According to an embodiment, it shows the case that the gate electrode GE is the lower electrode CE1 of the storage capacitor Cst, but the invention is not limited thereto, and the lower electrode CE1 may be formed as a separate electrode in another embodiment.

A third insulating layer IL3 is positioned on the upper electrode CE2 위에는 한다. The third insulating layer IL3 may be single-layered or multi-layered including at least one among inorganic insulators such as a silicon oxide, a silicon nitride, a silicon oxynitride, an aluminum oxide, a titanium oxide, a tantalum oxide, and a hafnium oxide.

The source electrode SE and the drain electrode DE are positioned on the third insulating layer IL3. The source electrode SE and the drain electrode DE are connected to the first area P and the second area Q of the semiconductor layer ACT, respectively, through contact holes defined in the first insulating layer ILL the second insulating layer IL2, and the third insulating layer IL3.

The source electrode SE and the drain electrode DE may include a conductive material including molybdenum (Mo), aluminum (Al), copper (Cu), titanium (Ti), and the like, and may be single-layered or multi-layered including the above-described material. As an embodiment, the source electrode SE and the drain electrode DE may have a multi-layered structure (Ti/Al/Ti) of a titanium layer, an aluminum layer, and a titanium layer.

A fourth insulating layer IL4 is positioned on the third insulating layer IL3, the source electrode SE, and the drain electrode DE. The fourth insulating layer IL4 may include a general-purpose polymer such as poly(methyl methacrylate) ("PMMA") or polystyrene ("PS"), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, and blends thereof.

A connection electrode CE is positioned on the fourth insulating layer IL4. The connection electrode CE may be connected to the drain electrode DE through a contact hole formed in the fourth insulating layer IL4.

The connection electrode CE may include a conductive material including molybdenum (Mo), aluminum (Al), copper (Cu), and titanium (Ti), and may be multi-layered or single-layered including the above-described materials. As an embodiment, the connection electrode CE may be the multi-layered structure (Ti/Al/Ti) of a titanium layer, an aluminum layer, and a titanium layer.

A fifth insulating layer IL5 is positioned on the connection electrode CE. The fifth insulating layer IL5 may include a general-purpose polymer such as poly(methyl methacrylate) (PMMA) or polystyrene (PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, and blends thereof.

An auxiliary layer HL may be positioned on the fifth insulating layer IL5. The auxiliary layer may be connected to the connection electrode CE though a contact hole formed in the fifth insulating layer IL5. The auxiliary layer HL may include at least one among titanium (Ti) and molybdenum (Mo). The thickness $t_a$ of the auxiliary layer HL may be about 160 angstroms (Å) to about 700 angstroms.

The first electrode E1 may be disposed directly on the auxiliary layer HL. The area of the first electrode E1 may be smaller than the area of the auxiliary layer HL. The area of the auxiliary layer HL may be larger than the area of the first electrode E1. As shown in FIG. 5B, the auxiliary layer HL and the first electrode E1 may have a similar shape in a plan view. The first electrode E1 may be disposed on the upper surface of the auxiliary layer HL.

The edge of the auxiliary layer HL and the edge of the first electrode E1 may be parallel in their corresponding parts. The edge of the auxiliary layer HL may be disposed outside the edge of the first electrode E1 in a plan view. The edge of the auxiliary layer HL may have a shape surrounding the edge of the first electrode E1. The present specification describes the embodiment in which the shapes of the auxiliary layer HL and the first electrode E1 are similar, however the invention is not limited thereto, and any shape of the edge of the auxiliary layer HL surrounding the edge of the first electrode E1 is possible.

The auxiliary layer HL and the first electrode E1 are electrically connected to the drain electrode DE through a contact hole of the fifth insulating layer IL5. The first electrode E1 may be electrically connected to the drain electrode DE through a sacrificial layer HL of a metal layer and the connection electrode CE. This specification shows an embodiment in which only a part of the sacrificial layer HL is positioned within the contact hole of the fifth insulating layer IL5, but the invention not limited thereto, and another embodiment in which the auxiliary layer HL and the first electrode E1 are sequentially positioned within the contact hole of the fifth insulating layer IL5 is possible.

The first electrode E1 may include metals such as silver (Ag), lithium (Li), calcium (Ca), aluminum (Al), magnesium (Mg), and gold (Au), or may also include a transparent conductive oxide ("TCO") such as an indium tin oxide ("ITO") and an indium zinc oxide ("IZO"). The first electrode E1 may consist of a single layer including the metal material or the transparent conductive oxide or multiple layers including them. For example, the first electrode E1, as shown in FIG. 5C, may have a triple layered structure including a first layer E1-$a$ containing an indium tin oxide (ITO), a second layer E1-$b$ containing silver (Ag), and a third layer E1-$c$ containing an indium tin oxide (ITO).

The auxiliary layer HL according to an embodiment may prevent outgassing generated from the fifth insulating layer IL5 during the manufacturing process. Accordingly, the light-emitting element positioned on the auxiliary layer HL may provide further improved display quality.

The transistor Tr including the gate electrode GE, the semiconductor layer ACT, the source electrode SE, and the drain electrode DE is electrically connected to the first electrode E1 to supply a current to the light-emitting element.

A pixel definition layer IL6 is positioned on the first electrode E1. The pixel definition layer IL6 overlaps at least a part of the first electrode E1. Particularly, the pixel definition layer IL6 overlaps the edge of the first electrode E1 in a plan view. Also, the pixel definition layer IL6 overlaps the edge of the auxiliary layer HL. Since the auxiliary layer HL and the first electrode E1 are individually formed for each pixel, the auxiliary layer HL and the first electrode E1 may overlap the edge of the pixel definition layer IL6.

The pixel definition layer IL6 has an opening that defines the emission area. For example, the width of the opening exposing the top surface of the first electrode E1 may correspond to the width of the emission area from which light is emitted, or the width of the pixel. The opening may have a rhombus or octagonal shape similar to a rhombus in a plan view, but the shape of the opening is not limited thereto, and may have any shape such as a quadrangle, a polygon, a circle, or an ellipse.

A spacer IL7 may be positioned on the pixel definition layer IL6. The pixel definition layer IL6 and the spacer IL7 may include an organic insulating material such as a general purpose polymer such as poly(methyl methacrylate) (PMMA) or polystyrene (PS), a polymer derivative having a phenolic group, an acryl-based polymer, an imide-based polymer, a polyimide, an acryl-based polymer, and a siloxane-based polymer.

The emission layer EML is positioned on the first electrode E1. The emission layer EML may include an organic material and/or an inorganic material. The emission layer EML may generate a predetermined colored light. The emission layer EML may be formed to be positioned only within the opening of the pixel definition layer IL6 by using a mask.

Intermediate layers ML1 and ML2 may be positioned on and under the emission layer EML. The first intermediate layer ML1 may include at least one among a hole injection layer ("HIL") and a hole transporting layer ("HTL"), and the second intermediate layer ML2 may be a multilayer including at least one among an electron transporting layer ("ETL") and an electron injection layer ("EIL").

The intermediate layers ML1 and ML2 may overlap the entire surface of the display area DA of the substrate SUB in a plan view. In the display area DA, the emission layers EML of different colors may be spaced apart from each other according to the color of the corresponding pixel, but the intermediate layers ML1 and ML2 may be formed to cover the display area DA as a whole. Each of the intermediate layers ML1 and ML2 may be shared by a plurality of pixels disposed in the display area DA. Each of the intermediate layers ML1 and ML2 may cover a plurality of first electrodes E1.

The second electrode E2 is disposed on the second intermediate layer ML2. The second electrode E2 may include a reflective metal such as calcium (Ca), barium (Ba), magnesium (Mg), aluminum (Al), silver (Ag), gold (Au), nickel (Ni), chromium (Cr), lithium (Li), and calcium (Ca), or a transparent conductive oxide (TCO) such as an indium tin oxide (ITO) and an indium zinc oxide (IZO).

The first electrode E1, the emission layer EML, and the second electrode E2 may constitute the light-emitting element. Here, the first electrode E1 may be an anode, which is a hole injection electrode, and the second electrode E2 may be a cathode, which is an electron injection electrode. However, the embodiment according to the invention is not limited thereto, and depending on the driving method of the emissive display device, the first electrode E1 may be the cathode and the second electrode E2 may be the anode in another embodiment.

Holes and electrons are injected from the first electrode E1 and the second electrode E2 into the emission layer EML, respectively, and light emission occurs when an exciton that is a combination of the injected hole and electron falls from an excited state to a ground state.

An encapsulation layer ENC is positioned on the second electrode E2. The encapsulation layer ENC may cover and seal not only the top surface of the light-emitting element, but also the side surface. Since the light-emitting element is very vulnerable to moisture and oxygen, the encapsulation layer ENC seals the light-emitting element to block the inflow of moisture and oxygen from the outside.

The encapsulation layer ENC may include a plurality of layers and may be formed of a composite film including both an inorganic layer and an organic layer, and for example, the encapsulation layer ENC may have a triple layer in which a first encapsulation inorganic layer EIL1, an encapsulation organic layer EOL, and a second encapsulation inorganic layer EIL2 are sequentially formed.

The first encapsulation inorganic layer EIL1 may cover the second electrode E2. The first encapsulation inorganic layer EIL1 may prevent external moisture or oxygen from penetrating the light-emitting element. For example, the first encapsulation inorganic layer EIL1 may be formed single-layered or multi-layered including at least one inorganic material such as an aluminum oxide, a titanium oxide, a tantalum oxide, a hafnium oxide, a zinc oxide, a silicon oxide, a silicon nitride, and a silicon oxynitride. The first encapsulation inorganic layer EIL1 may be formed through a deposition process.

The encapsulation organic layer EOL may be disposed on the first encapsulation inorganic layer EIL1 to be in contact with the first encapsulation inorganic layer EIL1. A curvature formed on the top surface of the first encapsulation inorganic layer EIL1 or particles present on the first encapsulation inorganic layer EIL1 are covered by the encapsulation organic layer EOL, so that the surface state of the top surface of the first encapsulation inorganic layer EIL1 may prevent the influence on the components formed on the encapsulation organic layer EOL. In addition, the encapsulation organic layer EOL can alleviate the stress between the contacting layers. The encapsulation organic layer EOL may include an organic material and may be formed through a solution process such as spin coating, slit coating, or an inkjet process.

The second encapsulation inorganic layer EIL2 is disposed on the encapsulation organic layer EOL to cover the encapsulation organic layer EOL. The second encapsulation inorganic layer EIL2 may be stably formed on a relatively flat surface rather than being disposed on the first encapsulation inorganic layer EIL1. The second encapsulation inorganic layer EIL2 prevents outflow to the outside by encapsulating moisture emitted from the encapsulation organic layer EOL. The second encapsulation inorganic layer EIL2 may be single-layered or general-purpose multi-layered including at least one inorganic such as an aluminum oxide, a titanium oxide, a tantalum oxide, a hafnium oxide, a zinc oxide, a silicon oxide, a silicon nitride, and a silicon oxynitride. The second encapsulation inorganic layer EIL2 may be formed through a deposition process.

Although not shown in the present specification, a capping layer disposed between the second electrode E2 and the encapsulation layer ENC may be further included. The capping layer may include an organic material. The capping layer protects the second electrode E2 from a subsequent process, for example, sputtering, and improves the light emission efficiency of the light-emitting element. The capping layer may have a greater refractive index than that of the first encapsulation inorganic layer EIL1.

Next, in the peripheral area LA surrounding the opening DTA, the buffer layer BF is positioned on the substrate SUB. The buffer layer BF may be formed to overlap the entire surface of the substrate SUB in a plan view. Some of the first insulating layer IL1 to the third insulating layer IL3 may be removed in the peripheral area LA. The first insulating layer IL1 to the third insulating layer IL3 may be spaced apart from the dam D1 positioned in the peripheral area LA. According to an embodiment, the ends of the first insulating layer IL1 to the third insulating layer IL3 may be covered by the fourth insulating layer IL4. In addition, the fourth insulating layer IL4 may also be removed in the peripheral area LA. The fourth insulating layer IL4 may be spaced apart from the dam D1 positioned in the peripheral area LA. According to an embodiment, the end of the fourth insulating layer IL4 may be covered by the fifth insulating layer IL5.

The first dam D1 and the second dam D2 may be positioned in order adjacent to the display area DA. The first dam D1 and the second dam D2 may be spaced apart from each other toward the opening DTA. The first dam D1 may be closest to the display area DA, and the second dam D2 may be closest to the opening DTA. The first dam D1 and the second dam D2 may be positioned in the peripheral area LA and may be positioned on the buffer layer BF. In an embodiment, two dams D1 and D2 positioned in the peripheral area LA are illustrated, but the present invention is not limited thereto, and two or more dams may be included in another embodiment.

The first dam D1 may include a first-1 sub-dam D1-*a*, a first-2 sub-dam D1-*b*, and a first-3 sub-dam D1-*c*. The first-1 sub-dam D1-*a* may be manufactured in the same process with the same material as the fifth insulating layer IL5 positioned in the display area DA. The first-2 sub-dam D1-*b* may be manufactured in the same process with the same material as the pixel definition layer IL6 positioned in the display area DA. The first-3 sub-dam D1-*c* may be manufactured in the same process with the same material as the spacer IL7. The first dam D1 may control the spread of the encapsulation organic layer EOL included in the encapsulation layer ENC during the manufacturing process.

The second dam D2 may include a second-1 sub-dam D2-a, a second-2 sub-dam D2-b, and a second-3 sub-dam D2-c. The second-1 sub-dam D2-a may be manufactured in the same process with the same material as the fifth insulating layer IL5 positioned in the display area DA. The second-2 sub-dam D2-b may be manufactured in the same process with the same material as the pixel definition layer IL6 positioned in the display area DA. The second-3 sub-dam D2-c may be manufactured in the same process with the same material as the spacer IL7 positioned in the display area DA. The second dam D2 may have substantially the same shape as the first dam D1.

The dam shown in this specification, as shown in FIG. 4A, has a ring shape surrounding the opening DTA in a plan view. However, this is an example of a shape, and the first and second dams D1 and D2 may have a different shape than the opening DTA. For example, the first and second dams D1 and D2 may have a shape including a polygon, an ellipse, or a closed line shape including at least some curved lines, or may be provided in a shape including a plurality of patterns that are partially cut off, but the invention is not limited to any one embodiment.

The peripheral area LA may include intermediate layers ML1-h and ML2-h that are cut from the intermediate layers ML1 and ML2 disposed in the display area DA. That is, some of the intermediate layers ML1 and ML2 may be removed from the peripheral area LA. The intermediate layers ML1 and ML2 may include a cutting part OA positioned in the peripheral area LA. According to an embodiment, a plurality of cutting parts OA may be positioned in the peripheral area LA. The openings of the first intermediate layer ML1 and the second intermediate layer ML2 overlap each other in a plan view, thereby forming one cutting part OA. Due to the cutting part OA, the first intermediate layer ML1 and the second intermediate layer ML2 may be discontinuous. Through the first intermediate layer ML1 and the second intermediate layer ML2, the path through which moisture or foreign particles penetrate may be effectively blocked.

The insulating layer, for example, the buffer layer BF disposed under the cutting part OA, may be exposed through the cutting part OA. The first encapsulation inorganic layer EIL1 may be in contact with the buffer layer BF through the cutting part OA. It is possible to block the progress of moisture or foreign particles through the contact between the first encapsulation inorganic layer EIL1 and the buffer layer BF. According to an embodiment, the insulating layer exposed through the cutting part OA may be an insulating layer other than the buffer layer BF.

The second electrode E2 overlapping the display area DA may extend to overlap a part of the peripheral area LA in a plan view. The end part CB of the second electrode E2 may be disposed between the display area DA and the first dam D1. The layer corresponding to the second electrode E2 may be removed from the area where the end part CB of the second electrode E2 is positioned to the opening DTA. That is, a layer having the same material and same stacked structure as the second electrode E2 is not disposed from the area where the end part CB of the second electrode E2 is positioned to the opening DTA.

The end part CB of the second electrode E2 may be covered by the encapsulation organic layer EOL. The second electrode E2 may be formed by removing a part of the second electrode material layer formed to overlap the display area DA and the peripheral area LA in a plan view. A part of the second electrode material layer may be removed through a laser lift-off process. At this time, in the thin-thick second electrode material layer, the end part may be rolled up by an irradiated laser, and as shown, the second electrode E2 may include the end part CB in a form of a burr. The end part CB of the second electrode E2 may be rolled up in an oblique direction away from the top surface of the substrate SUB. In addition, the cross-section of the end part CB of the second electrode E2 may have an irregular protrusions and depressions shape.

The first encapsulation inorganic layer EIL1 disposed on the second electrode E2 may cover the end part CB of the second electrode E2. In the first encapsulation inorganic layer EIL1 may include a portion having a thin thickness locally since the end part CB of the second electrode E2 has the irregular shape. At this time, cracks may be generated in the first encapsulation inorganic layer EIL1, but crack transfer may be covered by the encapsulation organic layer EOL.

Figure 6A:
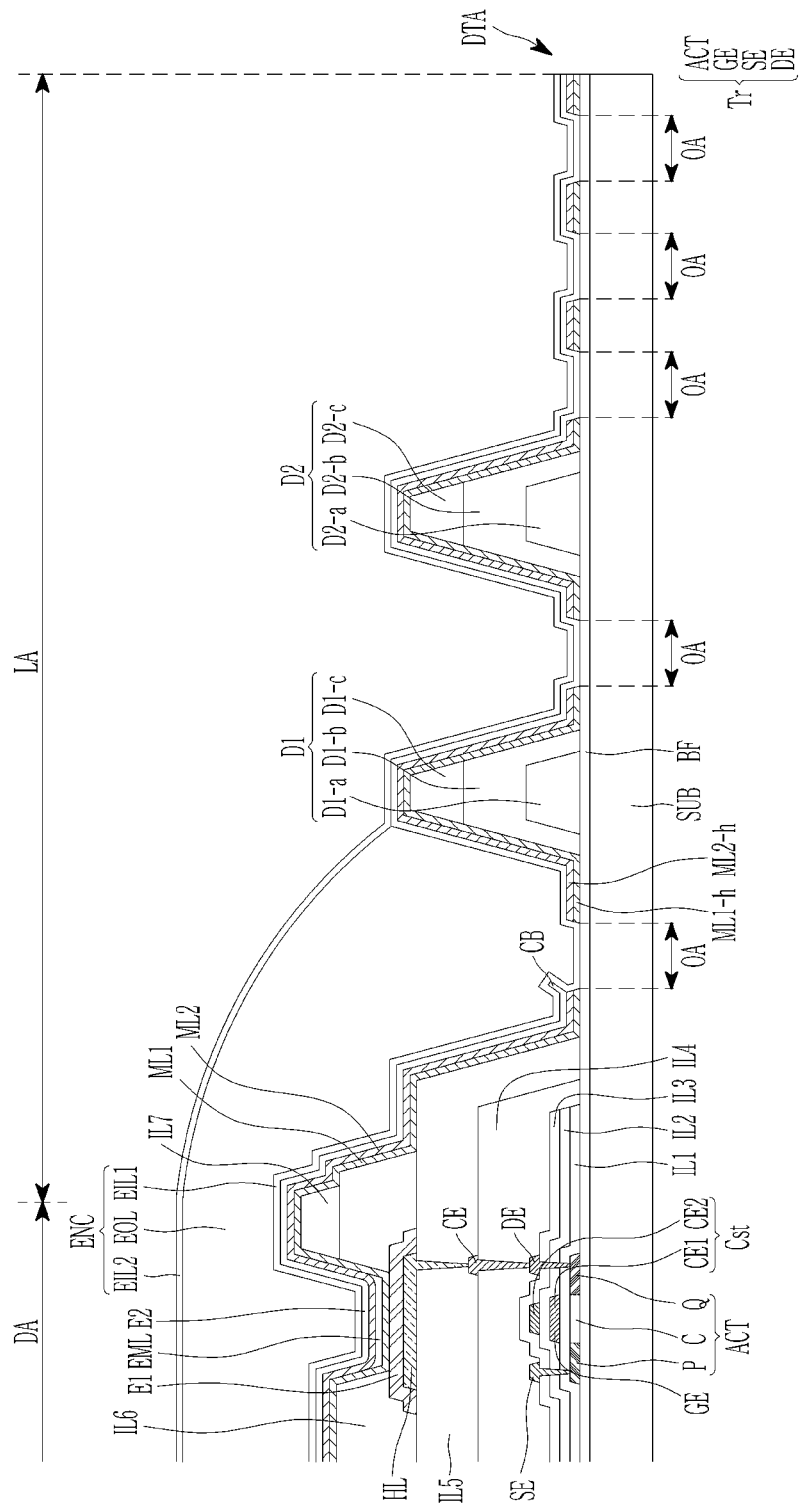
FIG. 6A is a cross-sectional view of a display panel corresponding to some areas according to another embodiment.
Figure 6B:
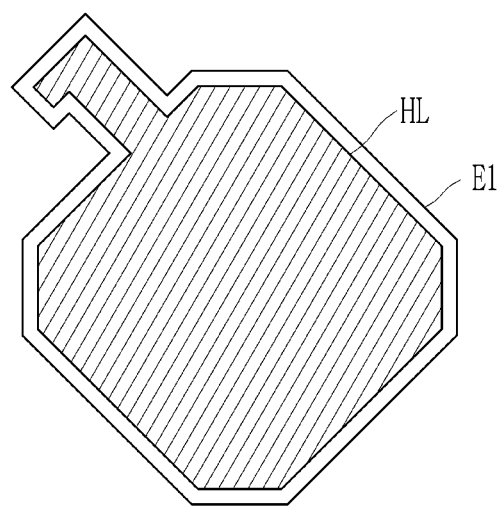
FIG. 6B is a top plan view schematically showing a first electrode and an auxiliary layer.

Next, it is described with reference to FIG. 6A and FIG. 6B. FIG. 6A is a cross-sectional view of a display panel corresponding to some areas according to another embodiment, and FIG. 6B is a top plan view schematically showing a first electrode and an auxiliary layer. The description of the same constituent elements as the above-described constituent elements is omitted.

As shown in FIG. 6A and FIG. 6B, the area of the auxiliary layer HL according to an embodiment may be smaller than the area of the first electrode E1. The edge of the auxiliary layer HL may be disposed inside the edge of the first electrode E1. The edge of the auxiliary layer HL and the edge of the first electrode E1 may be parallel to each other. The auxiliary layer HL and the first electrode E1 may have a shape similar to each other in a plan view and may have substantially the same shape. However, the invention is not limited thereto, and the planar area of the first electrode E1 is wider than that of the auxiliary layer HL and any shape in which the first electrode E1 completely covers the auxiliary layer HL is possible.

As shown in FIG. 6B, the first electrode E1 may have the shape completely covering the auxiliary layer HL. The first electrode E1 may cover the side of the auxiliary layer HL. The first electrode E1 may be extended to be in contact with the upper surface of the fifth insulating layer IL5 while covering the side surface of the auxiliary layer HL. The first electrode E1 may have a step in the area overlapping the end of the auxiliary layer HL in a plan view.

Figure 7A:
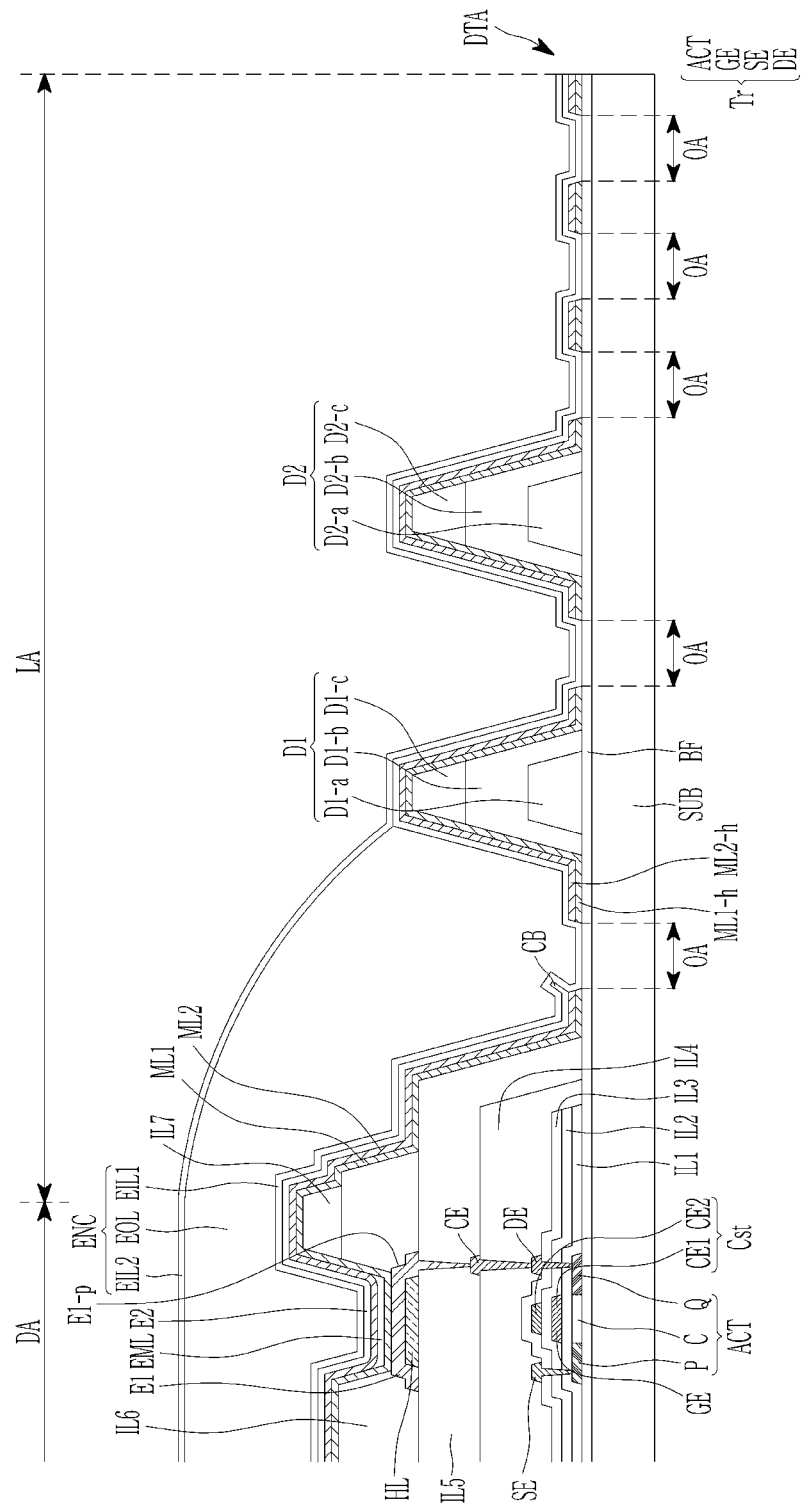
FIG. 7A is a cross-sectional view of a display panel corresponding to some areas according to still another embodiment.
Figure 7B:
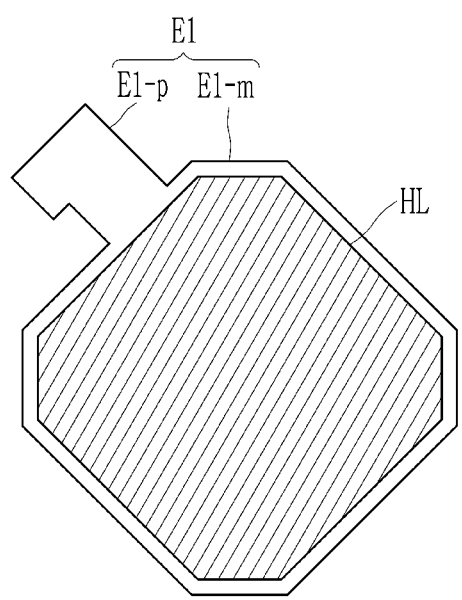
FIG. 7B is a top plan view schematically showing a first electrode and an auxiliary layer.

Next, it is described with reference to FIG. 7A and FIG. 7B. FIG. 7A is a cross-sectional view of a display panel corresponding to some areas according to still another embodiment, and FIG. 7B is a top plan view schematically showing a first electrode and an auxiliary layer. The description of the same constituent elements as the above-described constituent elements is omitted.

As shown in FIG. 7A and FIG. 7B, the area of the auxiliary layer HL according to an embodiment may be smaller than the area of the first electrode E1. The edge of the auxiliary layer HL may be disposed inside the edge of the first electrode E1. The first electrode E1 may have a shape that completely covers the auxiliary layer HL. The first electrode E1 may cover the side of the auxiliary layer HL. The first electrode E1 may be extended to be in contact with the upper surface of the fifth insulating layer IL5 while covering the side surface of the auxiliary layer HL. The first electrode E1 may have a step in the area overlapping the end of the auxiliary layer HL.

In addition, the auxiliary layer HL according to an embodiment may not overlap the connection electrode CE.

The auxiliary layer HL may not directly receive a separate signal. The first electrode E1 may be connected to the connection electrode CE through a contact hole formed in the fifth insulating layer IL5.

Referring to FIG. 7B, the first electrode E1 may include a main body E1-*m* and a protruded part E1-*p*. The protruded part E1-*p* may extend from the main body E1-*m* and in contact with the connection electrode CE. The auxiliary layer HL according to an embodiment may be spaced apart from the protruded part E1-*p* while overlapping the main body E1-*m* in the plan view. The auxiliary layer HL may have an island shape having substantially the same shape as the main body E1-*m*. Next, a manufacturing method of a display panel according to an embodiment is described with reference to FIG. 8A to FIG. 8E. FIG. 8A, 8B, 8C, 8D, and FIG. 8E are cross-sectional views of a display panel according to a manufacturing process, respectively.

Figure 8A:
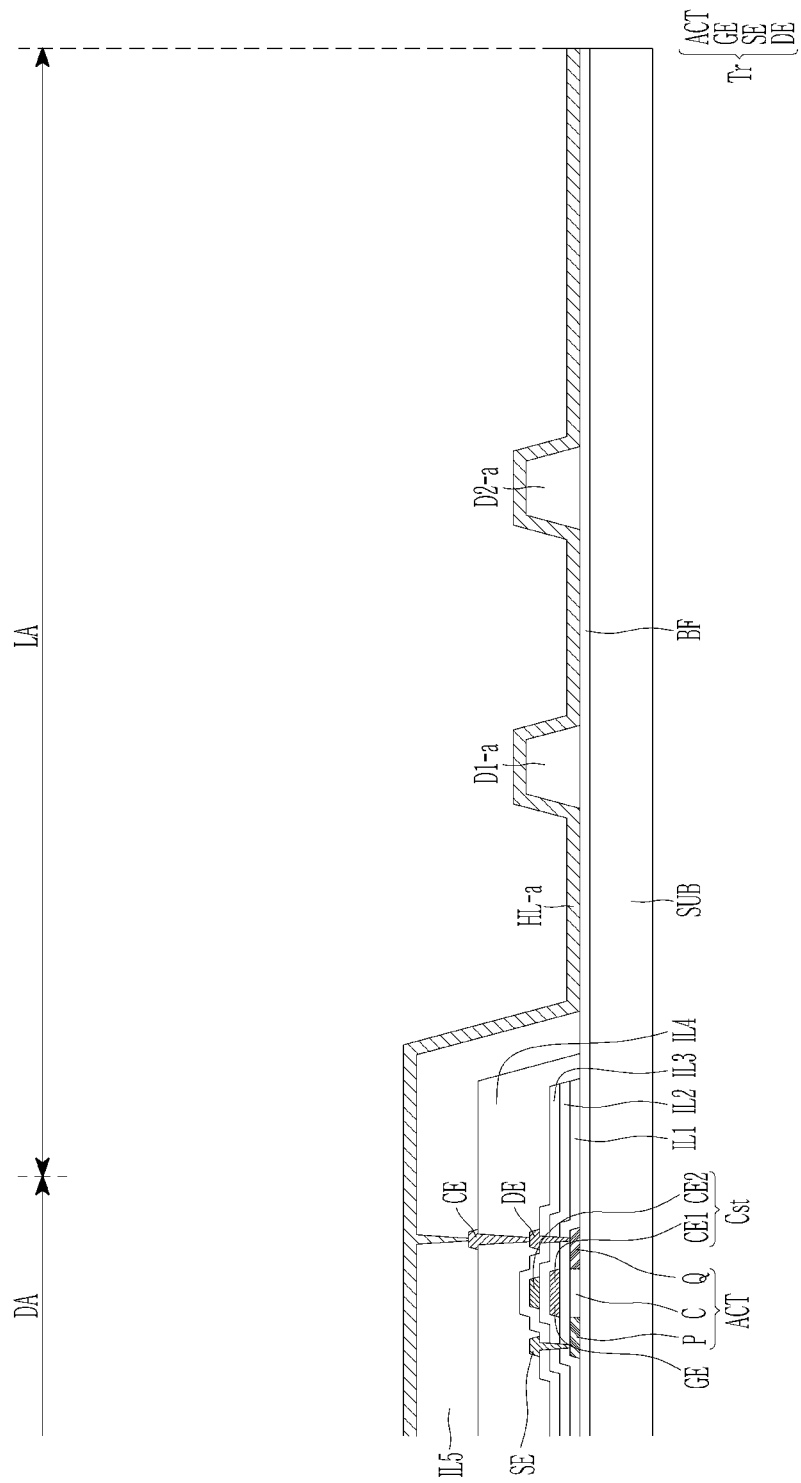
FIG. 8A, 8B, 8C, 8D, and FIG. 8E are a cross-sectional view of a display panel according to a manufacturing process, respectively.

First, referring to FIG. 8A, a transistor Tr including a semiconductor layer ACT, a gate electrode GE, a source electrode SE, and a drain electrode DE is formed on a substrate SUB overlapping the display area in a plan view.

In detail, a buffer layer BF may be formed on the substrate SUB. Next, a semiconductor layer ACT of the transistor Tr, a first insulating layer ILL a gate electrode GE and a lower electrode CE1 of a storage capacitor, a second insulating layer IL2, an upper electrode CE2 of the storage capacitor, a third insulating layer IL3, a source electrode SE and a drain electrode DE, a fourth insulating layer IL4, a connection electrode CE, and a fifth insulating layer IL5 may be sequentially formed.

The buffer layer BF may be formed to overlap the entire surface of the substrate SUB in a plan view. Part of the first insulating layer IL1 to the third insulating layer IL3 may be removed. The first insulating layer IL1 to the third insulating layer IL3 may be removed in the peripheral area LA. The first insulating layer IL1 to the third insulating layer IL3 may be spaced apart from the dam positioned in the peripheral area LA. According to an embodiment, the ends of the first insulating layer IL1 to the third insulating layer IL3 may be covered by the fourth insulating layer IL4. In addition, the fourth insulating layer IL4 may also be removed from the peripheral area LA. The fourth insulating layer IL4 may be spaced apart from the dam positioned in the peripheral area LA. According to an embodiment, the end of the fourth insulating layer IL4 may be covered by the fifth insulating layer IL5.

In the peripheral area LA, the buffer layer BF, and the first-1 dam D1-*a* and the second-1 dam D2-*a*, may be disposed. The first-1 dam D1-*a* and the second-1 dam D2-*a* may be formed in the same process as the fifth insulating layer IL5 positioned in the display area DA.

After that, an auxiliary material layer HL-*a* is formed to overlap the entire surface of the substrate SUB in a plan view. The auxiliary material layer HL-*a* may include at least one of titanium (Ti) and molybdenum (Mo). The thickness of the auxiliary material layer HL-*a* may be about 160 angstroms to about 700 angstroms.

Figure 8B:
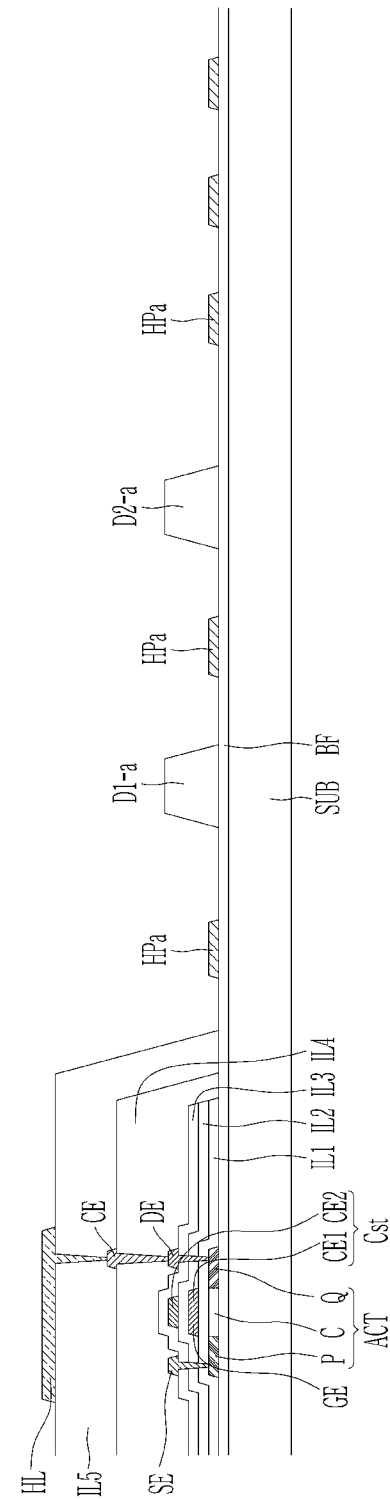

Then, as shown in FIG. 8B, through the patterning process, an auxiliary layer HL positioned in the display area DA and a plurality of sacrificial patterns HPa disposed in the peripheral area LA are formed. As an example, the process of forming the auxiliary layer HL and a plurality of sacrificial patterns HPa may include, for example, forming a photosensitive pattern, etching the exposed area using the photosensitive pattern as a mask, and removing the photosensitive pattern and the exposed area.

According to an embodiment, the auxiliary layer HL may be connected to the connection electrode CE through a contact hole formed in the fifth insulating layer IL5. However, the invention is not limited thereto, and an embodiment in which the auxiliary layer HL is formed on the fifth insulating layer IL5 in the shape similar to the first electrode E1 without being in contact with the connection electrode CE is possible. However, the invention is not limited thereto, and an embodiment in which the fifth insulating layer may be omitted and the auxiliary layer HL is formed on the fourth insulating layer IL4 with the connection electrode CE is possible.

In the process forming the auxiliary layer HL, when the auxiliary layer HL is not formed in the display area DA, the fifth insulating layer IL5 including the organic material may be damaged by the process of forming the sacrificial pattern HPa. Therefore, the first electrode E1 is formed on the damaged fifth insulating layer IL5, and the light-emitting element including the first electrode E1 may have a problem in that the display quality is deteriorated. However, according to an embodiment of the invention, by forming the auxiliary layer HL under the area to form the first electrode E1, the damage of the fifth insulating layer IL5 overlapping with the first electrode E1 in a plan view may be effectively prevented, and the first electrode E1 and the light-emitting element including the first electrode E1 may be formed to be stable. In addition, the auxiliary layer HL positioned on the fifth insulating layer IL5 may block outgassing of the fifth insulating layer IL5.

The sacrificial pattern HPa may be disposed between the end of the fifth insulating layer IL5 and the first-1 dam D1-*a*, between the first-1 dam D1-*a* and the second-1 dam D2-*a*, and between the second-1 dam D2-*a* and the opening DTA. However, the invention is not limited thereto, and any one may be omitted or may be positioned on the dam. Each width of a plurality of sacrificial patterns HPa may be different from each other or may be the same as each other.

Figure 8C:
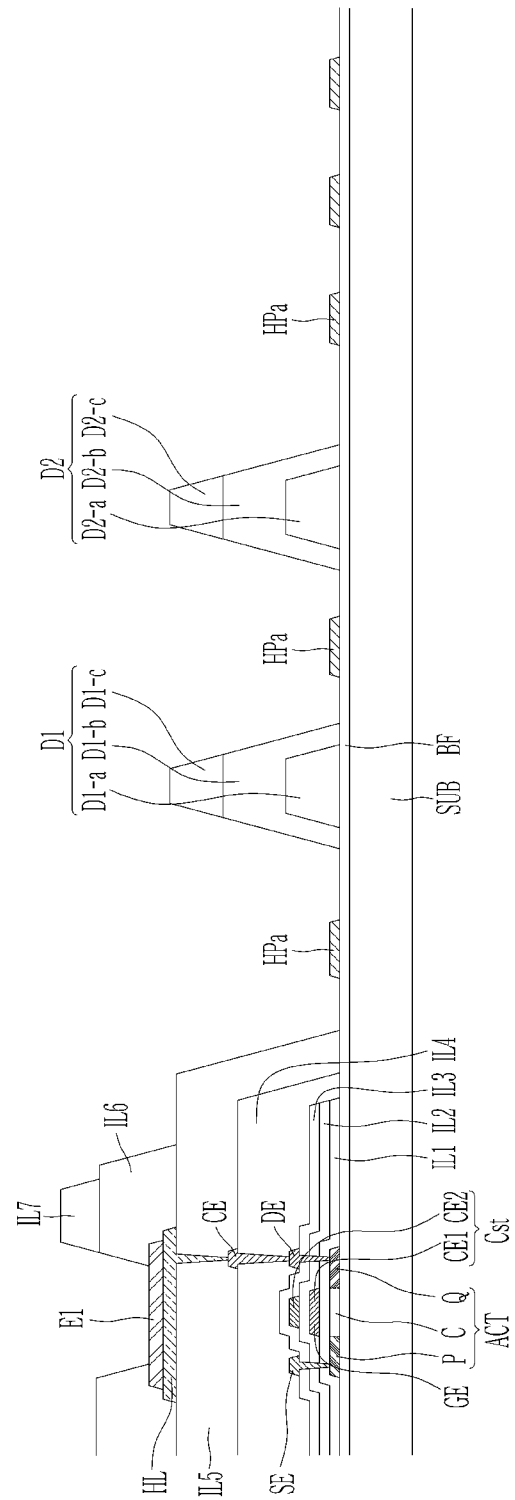

Next, as shown in FIG. 8C, a first electrode E1 is formed on the auxiliary layer HL. The edge of the first electrode E1 may be disposed inside the edge of the auxiliary layer HL. The first electrode E1 may have a smaller area while having substantially the same shape as the auxiliary layer HL. Since the first electrode E1 is positioned only on the upper surface of the auxiliary layer HL, the first electrode E1 may be formed in a stable shape without breaking the first electrode E1. However, the invention is not limited thereto, and may be formed in the same shape as the embodiment of FIG. 6B and FIG. 7B in another embodiment.

A pixel definition layer IL6 and a spacer IL7 may be formed on the first electrode E1. The pixel definition layer IL6 may be formed to overlap the edge of first electrode E1 and the auxiliary layer HL.

In the peripheral area LA), the first-2 dam D1-*b* and the second-2 dam D2-*b* may be formed in the same process as the pixel definition layer IL6. Also, the first-3 dam D1-*c* and the second-3 dam D2-*c* may be formed in the same process as the spacer IL7.

Figure 8D:
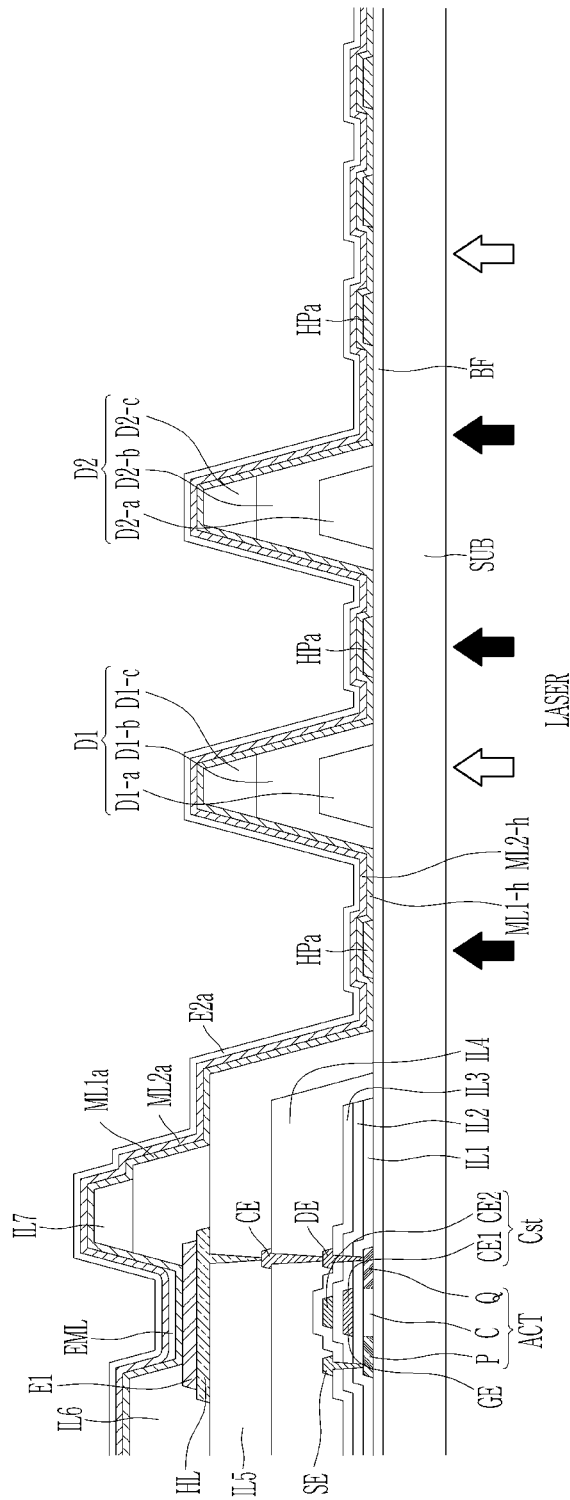

Next, as shown in FIG. 8D, a first intermediate material layer ML1*a*, an emission layer EML, a second intermediate material layer ML2*a*, and a second electrode material layer E2*a* are formed on the first electrode E1. The first intermediate material layer ML1*a*, the second intermediate material layer ML2*a*, and the second electrode material layer E2*a* may be formed to overlap the entire surface of the substrate SUB. The emission layer EML may be formed to be disposed within the pixel definition layer IL6.

Afterwards, a laser irradiation process is performed centering on the area where the sacrificial pattern HPa is positioned. The laser may be irradiated along the direction from the back surface of the substrate SUB to the top. The output of the irradiated laser may be set based on the bandgap of the second electrode E2. The laser may be irradiated once or multiple times, and when being irradiated multiple times, a type of the laser, the output, and/or an irradiation range (or the size of the laser beam) may be changed. According to an embodiment, a relatively high-output laser (a dark arrow) may be irradiated in some areas, and a relatively low-output laser (a transparent arrow) may be irradiated in other areas.

The laser may be irradiated based on the sacrificial pattern HPa positioned between the display area DA and the first dam D1. The second electrode material layer E2a positioned in the area where the laser is irradiated may be removed. In addition, the sacrificial pattern HPa may be heated and separated at a predetermined temperature by absorbing the irradiated laser. The first intermediate material layer ML1a and the second intermediate material layer ML2a positioned on the separated sacrificial pattern HPa may be removed.

Figure 8E:
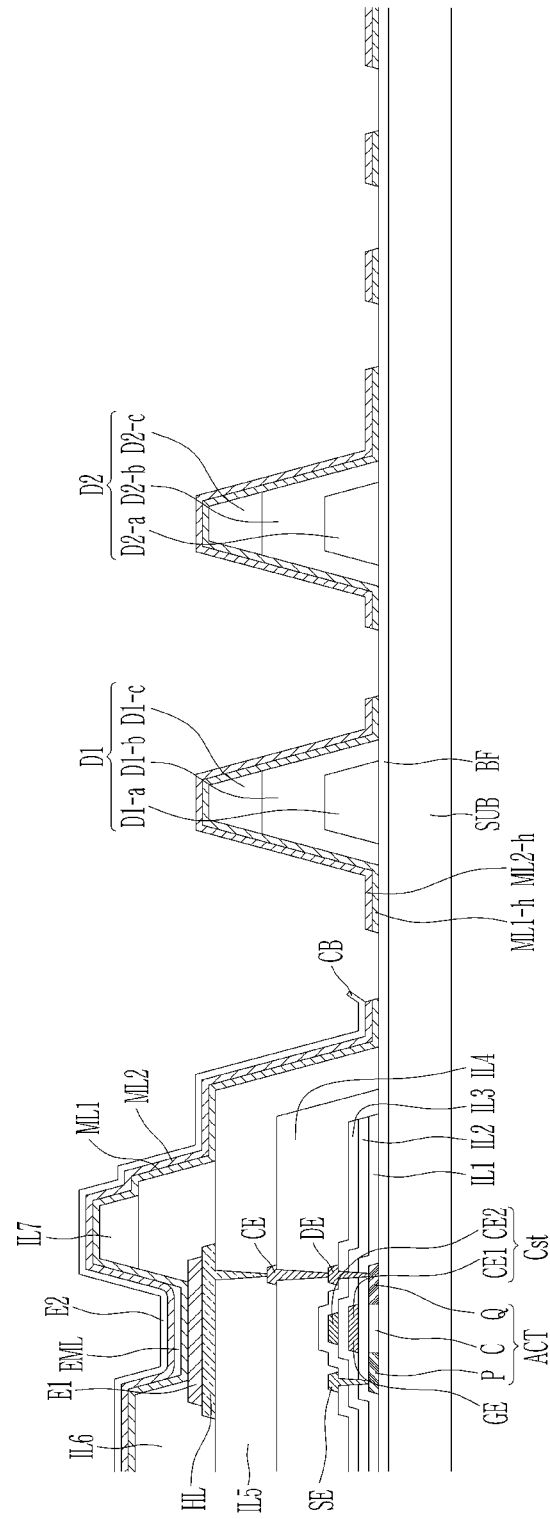

By this laser lift-off process, as shown in FIG. 8E, the first intermediate layer ML1-h and the second intermediate layer ML2-h of the disconnected form in the peripheral area may be formed. The invention is not limited to the shape shown in FIG. 8E, and the shape and position of the first intermediate layer ML1, the second intermediate layer ML2, and the second electrode E2 may be variously changed according to the number and position of the sacrificial pattern HPa, and the irradiation range of the laser.

After that, an encapsulation layer ENC is formed on the second electrode E2 and an opening DTA is formed using a cutting process, thereby providing the display panel as shown in 5A.

Figure 9A:
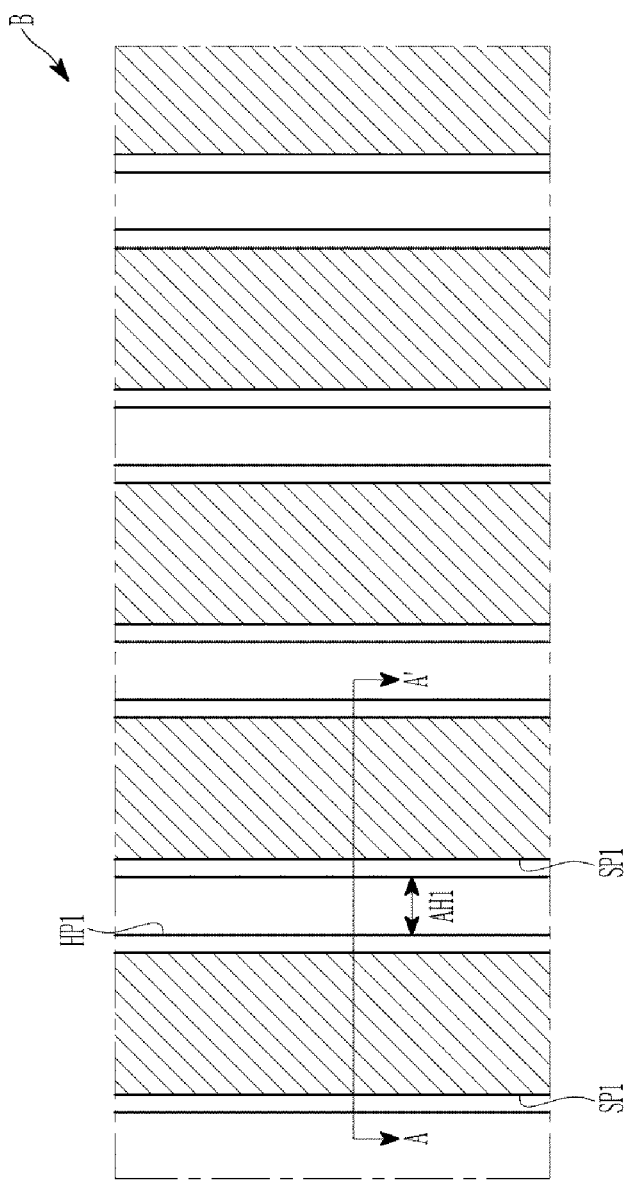
FIG. 9A is a top plan view of some wirings positioned in a non-display area according to an embodiment.
Figure 9B:
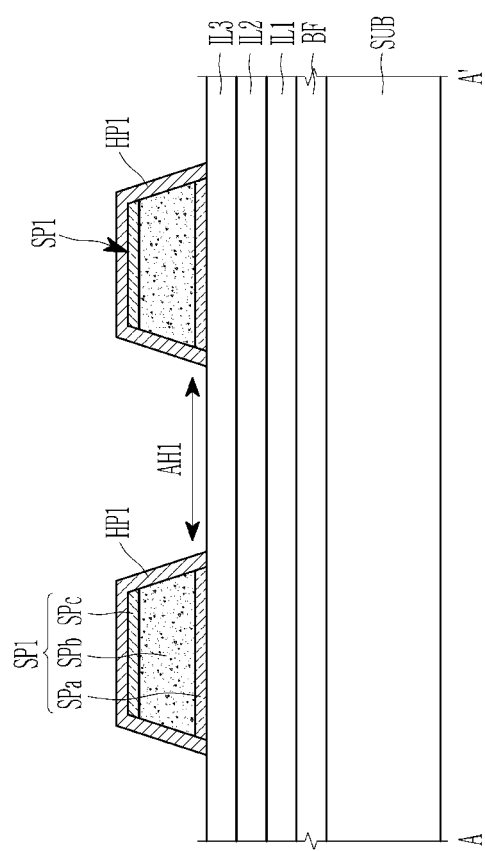
FIG. 9B is a cross-sectional view taken along line A-A' of FIG. 9A.

Next, the signal wire positioned in the non-display area is described with reference to FIG. 9A and FIG. 9B. FIG. 9A is a top plan view of some wirings positioned in a non-display area according to an embodiment, and FIG. 9B is a cross-sectional view taken along line A-A' of FIG. 9A. The signal wire described in FIG. 9A and FIG. 9B may be possible as any signal wire connecting the pad part PAD shown in FIG. 3 and the display area DA. For example, FIG. 9A may be an enlarged top plan view of an area B of FIG. 3.

Referring to FIG. 9A and FIG. 9B, on the substrate SUB overlapping the non-display area PA, a buffer layer BF and a first insulating layer IL1 to a third insulating layer IL3 may be positioned. However, the present invention is not limited thereto, and at least one of the first insulating layer IL1 to the third insulating layer IL3 may be removed in another embodiment. Only an insulating layer made of an inorganic material may be positioned on at least a portion of the substrate SUB overlapping the non-display area in a plan view according to an embodiment.

The first signal wire SP1 may be positioned on the insulating layer made of the inorganic material according to an embodiment. A plurality of first signal wires SP1 may be disposed to be spaced apart from each other. The spacing between a plurality of first signal wires SP1 may be the same as or different from each other.

The first signal wire SP1 may include a first layer SPa, a second layer SPb, and a third layer SPc. As an example, the first layer Spa may include titanium, the second layer SPb may include aluminum, and the third layer SPc may include titanium, but the invention is not limited thereto.

The first signal wire SP1, as shown in FIG. 5A, may be disposed on the same layer as the source electrode SE and the drain electrode DE positioned in the display area DA or may be disposed on the same layer as the connection electrode CE. For example, the first signal wire SP1 may include the same material as the source electrode SE and the drain electrode DE and may be formed in the same process, or may include the same material as the connection electrode CE and may be formed in the same process. Also, the present invention is not limited thereto, and the first signal wire SP1 may include a first sub-signal wire formed in the same process as the source electrode SE and a second sub-signal wire formed in the same process as the connection electrode CE in another embodiment.

The first auxiliary pattern HP1 may be positioned on each first signal wire SP1. A plurality of first auxiliary patterns HP1 may be spaced apart from each other with a predetermined interval AH1.

The edge of the first auxiliary pattern HP1 and the edge of the first signal wire SP1 overlapping the first auxiliary pattern HP1 may be parallel. The first auxiliary pattern HP1 may have a shape extending along the extension direction of the first signal wire SP1. A plurality of first auxiliary patterns HP1 may be repeatedly disposed according to the direction in which a plurality of first signal wires SP1 is arranged.

Each of a plurality of first auxiliary patterns HP1 may have a shape covering each of a plurality of first signal wires SP1 in a plan view. The first auxiliary pattern HP1 may cover the side surfaces of the first layer SPa to the third layer SPc and the upper surface of the third layer SPc. The first auxiliary pattern HP1 may cover all of the exposed side of the first signal wire SP1.

The first auxiliary pattern HP1 according to an embodiment may include at least one of titanium (Ti) and molybdenum (Mo). For example, when the first layer SPa and the third layer SPc include titanium and the first auxiliary pattern HP1 includes titanium, it may be difficult to classify the layers as they are integrally formed. The first auxiliary pattern HP1 may be formed by etching the auxiliary material layer as in the process previously described in FIG. 8B. When the first layer SPa, the third layer SPc, and the auxiliary material layer are formed of the same material, there may be a problem that the third layer SPc is etched in the process of etching the auxiliary material layer. That is, not only the auxiliary material layer is etched, but the third layer SPc including the same material may be unnecessarily etched. Accordingly, the first signal wire SP1 may be damaged and the reliability of the device may be lowered as the second layer SPb is exposed. However, according to an embodiment of the invention, when including the first auxiliary pattern HP1 disposed in the non-display area, the first signal wire SP1 is not exposed and there is no fear of being etched, so the display device with improved the reliability may be provided.

Figure 10A:
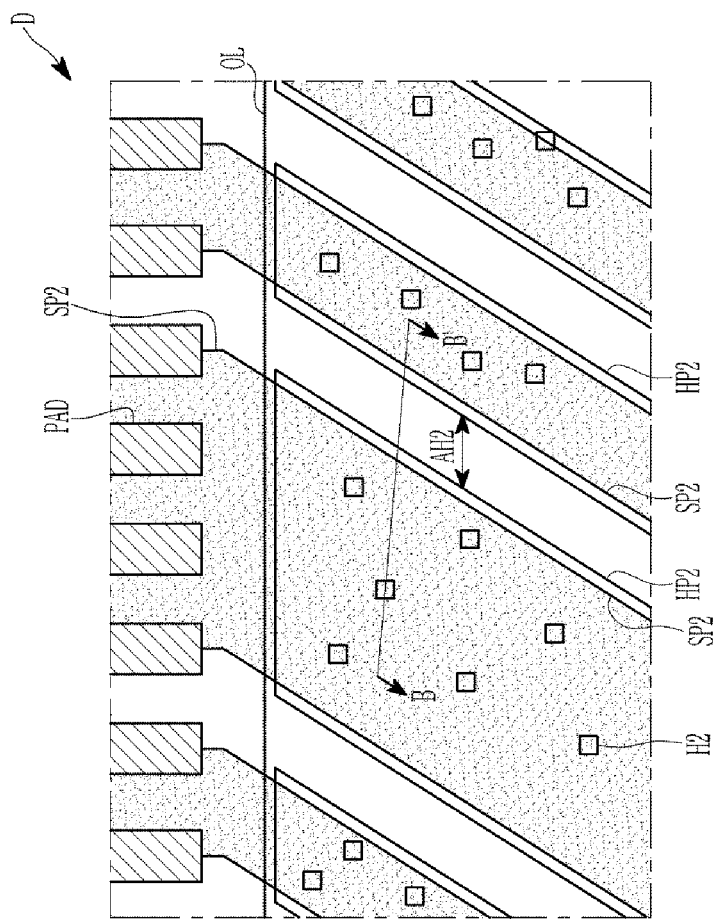
FIG. 10A is a top plan view of some wirings positioned in a non-display area according to an embodiment.
Figure 10B:
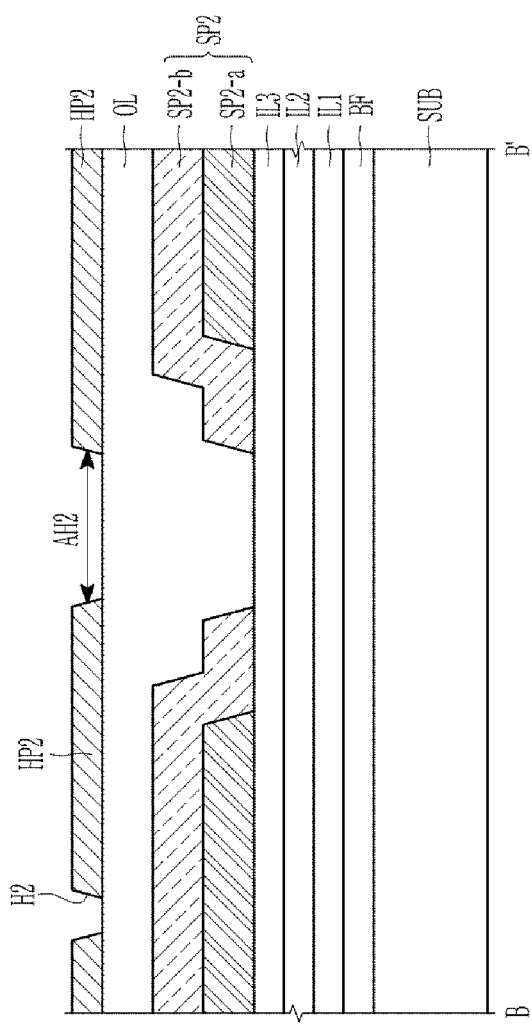
FIG. 10B is a cross-sectional view taken along line B-B' of FIG. 10A.
Figure 11A:
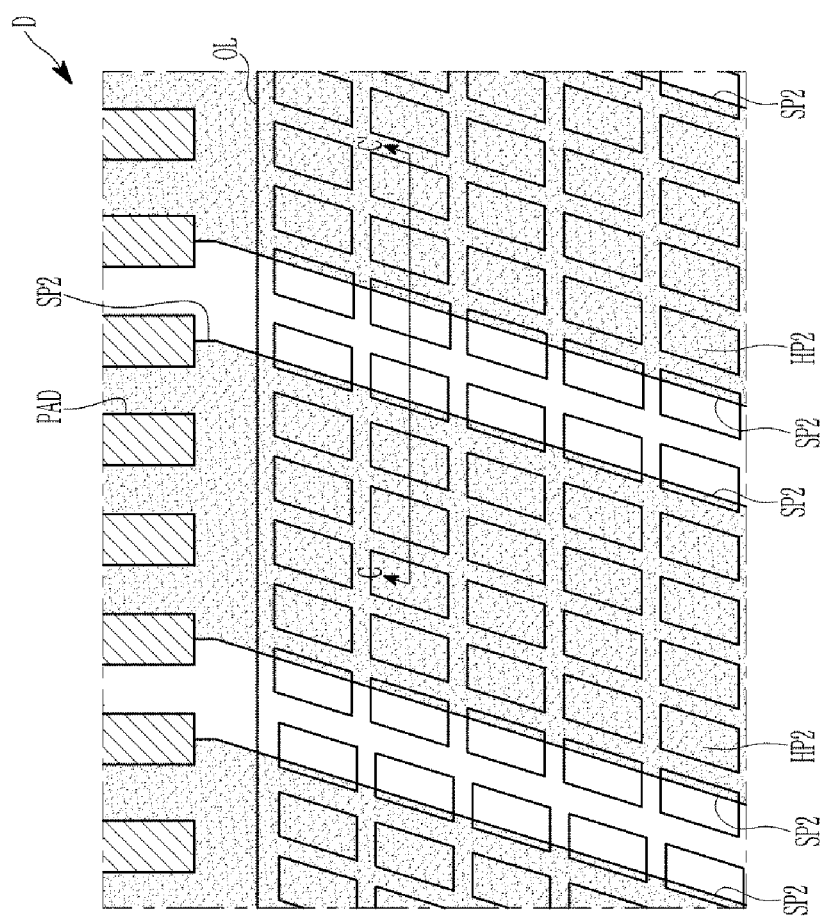
FIG. 11A is a top plan view of some wirings positioned in a non-display area according to another embodiment.
Figure 11B:
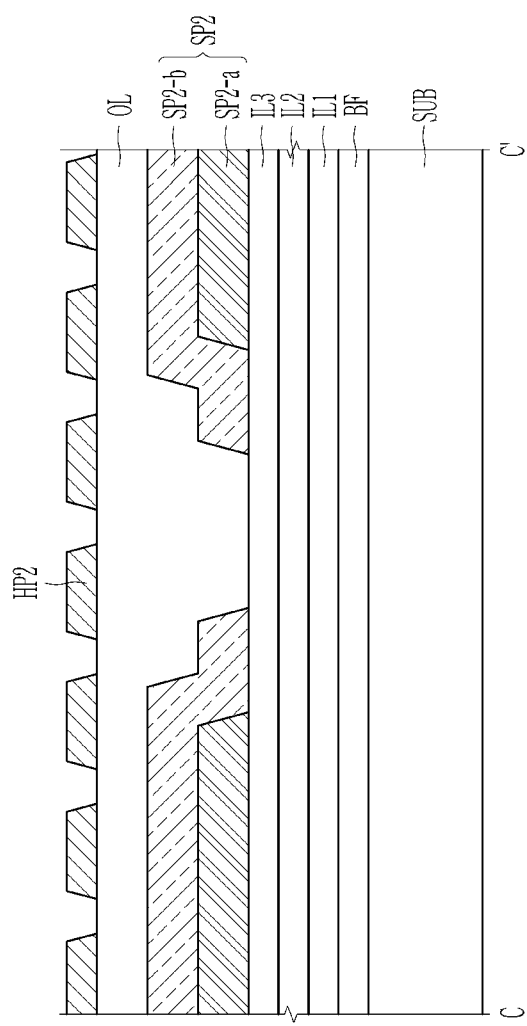
FIG. 11B is a cross-sectional view taken along line C-C' of FIG. 11A.

Next, the signal wire is described with reference to FIG. 10A to FIG. 11B. FIG. 10A is a top plan view of some wirings positioned in an area D among a non-display area of FIG. 3 according to an embodiment, and FIG. 10B is a cross-sectional view taken along line B-B' of FIG. 10A. FIG. 11A is a top plan view of some wirings positioned in an area D among a non-display area of FIG. 3 according to another embodiment, and FIG. 11B is a cross-sectional view taken along line C-C' of FIG. 11A. The signal wire described in FIG. 10A and FIG. 10B, and FIG. 11A and FIG. 11B, may be any signal wire connecting the pad part PAD shown in FIG. 3 and the display area DA or any signal wire connecting the driving chip 80 and the pad part PCB_P of the printed circuit board (PCB) PCB, and the invention is not limited thereto.

Referring to FIG. 10A and FIG. 10B, a buffer layer BF and a first insulating layer IL1 to a third insulating layer IL3 may be positioned on a substrate SUB. However, the invention is not limited to such a laminated structure, and at least one of the first insulating layer IL1 to the third insulating layer IL3 may be omitted. A second signal wire SP2 may be positioned on the third insulating layer IL3.

The second signal wire SP2 may include a first sub-signal wire SP2-a and a second sub-signal wire SP2-b. The first sub-signal wire SP2-a may include the same material as the source electrode SE and the drain electrode DE positioned in the display area DA, and may be formed in the same process. The second sub-signal wire SP2-b may include the same material as the connection electrode CE positioned in the display area DA, and may be formed in the same process. When each of the source electrode SE, the drain electrode DE, and the connection electrode CE is formed in multiple layers, the first sub-signal wire SP2-a and the second sub-signal wire SP2-b may also be formed in multiple layers. However, the present invention is not limited thereto, and the second signal wire SP2 may include only one of the first sub-signal wire SP2-a and the second sub-signal wire SP2-b in another embodiment.

An organic insulating layer OL may be positioned on at least part of the second signal wire SP2. The organic insulating layer OL may cover a plurality of second signal wires SP2. For example, the organic insulating layer OL may have a shape covering a plurality of second signal wires SP2 spaced apart along one direction (i.e., a direction on the plane defined by the first direction DR1 and the second direction DR2). For example, the organic insulating layer OL includes the same material as the fifth insulating layer IL5 positioned in the display area DA, and may be formed in the same process with the fifth insulating layer IL5.

A second auxiliary pattern HP2 may be disposed on the organic insulating layer OL. The second auxiliary pattern HP2 may be positioned on the flat top surface of the organic insulating layer OL. The second auxiliary pattern HP2 may include the same material as the auxiliary layer HL described in FIG. 5A and the first auxiliary pattern HP1 described in FIG. 9A, and may be formed of the same material with the auxiliary layer HL or the first auxiliary pattern HP1.

The second auxiliary pattern HP2 may overlap the second signal wire SP2 in a plan view in a one-to-one manner. A plurality of second auxiliary pattern HP2 may be spaced apart from each other to have a predetermined interval AH2 in a plan view. Since the second auxiliary pattern HP2 overlaps only one second signal wire SP2 and does not overlap with other adjacent second signal wires SP2, signal interference may be effectively prevented.

The edge of the second auxiliary pattern HP2 may be parallel to the edge of the second signal wire SP2. The second auxiliary pattern HP2 may have a shape extended along the extension direction of the second signal wire SP2. A plurality of second auxiliary patterns HP2 may be repeatedly disposed along the direction in which a plurality of second signal wires SP2 are disposed. This specification shows an embodiment in which a part of the edge of the second auxiliary pattern HP2 is positioned outside the edge of the corresponding second signal wire SP2 in a plan view, however the invention is not limited thereto, and another embodiment in which both edges are aligned or the edge of the second auxiliary pattern HP2 is positioned inside the edge of corresponding the second signal wire SP2 in a plan view may be possible.

The second auxiliary pattern HP2 may define a plurality of holes H2 overlapping the second signal wire SP2 therein in a plan view. Each of a plurality of holes H2 may expose the organic insulating layer OL disposed under the second auxiliary pattern HP2. The outgassing from the organic insulating layer OL may be smoothly achieved through the hole H2.

The invention is not limited to this shape, and the second auxiliary pattern HP2 as shown in FIG. 11A and FIG. 11B may be included in another embodiment. One second signal wire SP2 may overlap a plurality of second auxiliary patterns HP2. A plurality of second auxiliary pattern HP2 may be spaced apart from each other. A plurality of second auxiliary patterns HP2 may be spaced apart at the constant interval as shown, but the invention is not limited thereto, and another embodiment in which they are spaced apart at different intervals may be possible.

In addition, the second auxiliary pattern HP2 may have a square shape in a plan view, but the shape of the second auxiliary pattern HP2 is not limited thereto, and may be transformed into various shapes such as circular, elliptical, and polygonal shapes.

On the organic insulating layer OL, in the case of performing the process of removing the entire auxiliary material layer described in FIG. 8B, there may be a problem in that the etching is not completely performed due to the wide area requiring the etching. If the etching is not completely performed, the components deposited through a subsequent process may be lifted and then reliability of the device may be lowered.

However, according to an embodiment, the auxiliary material layer may be etched to have a predetermined pattern without removing the entire auxiliary material layer on the organic insulating layer OL. Accordingly, it is possible to prevent the occurrence of the non-uniform lifting due to not being completely etched as in the past.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

| | |
|---|---|
| DA: display area | LA: peripheral area |
| E1: first electrode | HL: auxiliary layer |
| IL6: pixel definition layer | EML: emission layer |
| E2: second electrode | D1, D2: dam |
| ENC: encapsulation layer | SP1: first signal wire |
| SP2: second signal wire | HP1: first auxiliary pattern |
| HP2: second auxiliary pattern | |

What is claimed is:

1. A display device comprising:
   a substrate including a display area and a peripheral area surrounding an opening;
   a transistor disposed in the display area;
   a first electrode electrically connected to the transistor;
   an auxiliary layer disposed between the transistor and the first electrode and overlapping the first electrode in a plan view;

a pixel definition layer overlapping the first electrode and an edge of the auxiliary layer in the plan view;

an intermediate layer, an emission layer, and a second electrode disposed on the first electrode;

at least one or more dams disposed on the peripheral area; and an encapsulation layer disposed on the second electrode, wherein the intermediate layer defines a cutting part disposed between the display area and the opening, wherein the auxiliary layer is electrically connected to the transistor and the first electrode.

2. The display device of claim 1, wherein the first electrode is disposed directly on the auxiliary layer.

3. The display device of claim 1, wherein the first electrode and the auxiliary layer have substantially a same shape in the plan view.

4. The display device of claim 1, wherein the edge of the auxiliary layer is disposed outside an edge of the first electrode in the plan view.

5. The display device of claim 1, wherein the edge of the auxiliary layer is disposed inside an edge of the first electrode in the plan view, and the first electrode covers a side surface of the auxiliary layer.

6. The display device of claim 5, wherein the first electrode includes a main body and a protruded part, and the auxiliary layer overlaps the main body in the plan view and is spaced apart from the protruded part.

7. The display device of claim 6, wherein the protruded part is electrically connected to the transistor.

8. The display device of claim 1, wherein the auxiliary layer includes at least one of titanium and molybdenum.

9. The display device of claim 8, wherein a thickness of the auxiliary layer is about 160 angstroms to about 700 angstroms.

10. A display device comprising:

a substrate including a display area and a non-display area;

a signal wire disposed in the non-display area; and an auxiliary pattern overlapping the signal wire in a plan view, wherein the signal wire includes a first layer, and a second layer, a part of the signal wire further includes a third layer between the first layer and the second layer, the third layer includes a different material from each of the first layer and the third layer, and an edge of at least a part of the signal wire and an edge of the auxiliary pattern are parallel to each other in the plan view.

11. The display device of claim 10, wherein the signal wire includes a first signal wire, the auxiliary pattern includes a first auxiliary pattern, and the first auxiliary pattern is disposed directly on the first signal wire.

12. The display device of claim 11, wherein the first auxiliary pattern covers a side surface of the first signal wire.

13. The display device of claim 11, wherein the first layer, the second layer, and the first auxiliary pattern include a same material.

14. The display device of claim 11, wherein the display device further includes:

a transistor and a light-emitting element disposed on the display area; and a connection electrode connecting the transistor and the light-emitting element, and the transistor includes:

a semiconductor layer positioned on the substrate;

a gate electrode overlapping the semiconductor layer in the plan view; and a source electrode and a drain electrode connected to the semiconductor layer.

15. The display device of claim 14, wherein the first signal wire includes a same material as at least one of the source electrode and the connection electrode.

16. The display device of claim 14, wherein the signal wire includes a second signal wire, the auxiliary pattern includes a second auxiliary pattern, and an organic insulating layer is positioned between the second signal wire and the second auxiliary pattern.

17. The display device of claim 16, wherein the second signal wire includes a same material as at least one of the source electrode and the connection electrode.

18. The display device of claim 16, wherein the second signal wire is provided in plural, and the second auxiliary pattern is provided in plural, the plurality of the second signal wires overlap the plurality of the second auxiliary patterns, respectively, and the second auxiliary pattern defines a plurality of holes overlapping the second signal wire in the plan view.

19. The display device of claim 16, wherein the second auxiliary pattern is provided in plural, the plurality of the second auxiliary patterns overlap the second signal wire, and the plurality of the second auxiliary patterns are spaced apart from each other.

20. The display device of claim 16, wherein the display device includes an auxiliary layer disposed between the transistor and the light-emitting element, and the auxiliary layer, the first auxiliary pattern, and the second auxiliary pattern include a same material.

* * * * *